US009254653B2

(12) United States Patent
Yoda

(10) Patent No.: US 9,254,653 B2
(45) Date of Patent: Feb. 9, 2016

(54) WIRING STRUCTURE, METHOD OF MANUFACTURING WIRING STRUCTURE, LIQUID DROPLET EJECTING HEAD, AND LIQUID DROPLET EJECTING APPARATUS

(71) Applicant: SEIKO EPSON CORPORATION, Tokyo (JP)

(72) Inventor: Tsuyoshi Yoda, Matsumoto (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/442,043

(22) PCT Filed: Feb. 24, 2014

(86) PCT No.: PCT/JP2014/000958
§ 371 (c)(1),
(2) Date: May 11, 2015

(87) PCT Pub. No.: WO2014/132615
PCT Pub. Date: Sep. 4, 2014

(65) Prior Publication Data
US 2015/0343768 A1 Dec. 3, 2015

(30) Foreign Application Priority Data

Feb. 26, 2013 (JP) .................................. 2013-035504

(51) Int. Cl.
*B41J 2/14* (2006.01)
*H05K 1/18* (2006.01)
*H05K 3/10* (2006.01)

(52) U.S. Cl.
CPC ............... *B41J 2/1433* (2013.01); *H05K 1/181* (2013.01); *H05K 3/10* (2013.01); *B41J 2002/14491* (2013.01); *H05K 2201/10212* (2013.01)

(58) Field of Classification Search
None
See application file for complete search history.

(56) References Cited

U.S. PATENT DOCUMENTS

| 2003/0218238 | A1 | 11/2003 | Kikuchi et al. |
| 2005/0250306 | A1 | 11/2005 | Akagawa et al. |
| 2006/0164466 | A1 | 7/2006 | Mizuno et al. |
| 2006/0164468 | A1 | 7/2006 | Yoda |
| 2006/0234534 | A1 | 10/2006 | Sato |
| 2007/0042613 | A1 | 2/2007 | Yoda |
| 2008/0079780 | A1 | 4/2008 | Xiao |
| 2012/0050413 | A1 | 3/2012 | Miyazawa |

FOREIGN PATENT DOCUMENTS

| EP | 1700701 A2 | 9/2006 |
| JP | H05-74989 A | 3/1993 |

(Continued)

*Primary Examiner* — Geoffrey Mruk
*Assistant Examiner* — Bradley Thies
(74) *Attorney, Agent, or Firm* — Harness, Dickey & Pierce, P.L.C.

(57) ABSTRACT

A liquid droplet ejecting head includes a vibrating plate on which terminals are formed, a reservoir forming substrate which is bonded to the vibrating plate and has a through portion having an inclined surface at an acute angle with respect to the vibrating plate as an inner wall, a substrate which is located on an opposite side to the vibrating plate through the reservoir forming substrate, is bonded to the reservoir forming substrate, and has terminals formed thereof, an IC package which is mounted on the substrate and is electrically connected to the terminals of the substrate, and wirings which are formed on the inclined surface and electrically connect the terminals on the vibrating plate and the terminals on the substrate.

8 Claims, 16 Drawing Sheets

(56) References Cited

FOREIGN PATENT DOCUMENTS

| | | | |
|---|---|---|---|
| JP | H10-229144 | A | 8/1998 |
| JP | 2001-189414 | A | 7/2001 |
| JP | 2002-184942 | A | 6/2002 |
| JP | 2003-318317 | A | 11/2003 |
| JP | 2006-159492 | A | 6/2006 |
| JP | 2006-279016 | A | 10/2006 |
| JP | 2006-281763 | A | 10/2006 |
| JP | 2007-050638 | A | 3/2007 |
| JP | 2007-050639 | A | 3/2007 |
| JP | 3956955 | B2 | 8/2007 |
| JP | 2007-290232 | A | 11/2007 |
| JP | 2009-269314 | A | 11/2009 |
| JP | 4492520 | B2 | 6/2010 |
| JP | 4581664 | B2 | 11/2010 |
| JP | 4737502 | B2 | 8/2011 |
| JP | 2011-249481 | A | 12/2011 | ic driving liquid droplet ejecting
WIRING STRUCTURE, METHOD OF MANUFACTURING WIRING STRUCTURE, LIQUID DROPLET EJECTING HEAD, AND LIQUID DROPLET EJECTING APPARATUS

TECHNICAL FIELD

The present invention relates to a wiring structure, a method of manufacturing a wiring structure, a liquid droplet ejecting head, and a liquid droplet ejecting apparatus.

BACKGROUND ART

A liquid droplet ejecting apparatus which includes a liquid droplet ejecting head ejecting liquid droplets is used for, for example, image formation or manufacturing of wiring of a micro device.

For example, a piezoelectric driving liquid droplet ejecting head includes a reservoir which stores ink, a plurality of pressure generation chambers which communicate with the reservoir, a plurality of nozzles which respectively communicate with the plurality of pressure generation chambers, a plurality of piezoelectric elements which respectively change pressure in the plurality of pressure generation chambers, and a driver IC which drives the plurality of piezoelectric elements.

In this liquid droplet ejecting head, in general, as disclosed in JP-A-2006-281763, the piezoelectric elements and a reservoir forming substrate (wiring substrate) on which the reservoir is formed are bonded to one surface of a flow channel forming substrate (base substrate) on which the pressure generation chambers are formed. The driver IC is bonded to the surface of the reservoir forming substrate opposite to the flow channel forming substrate and electrically connected to the piezoelectric elements through wirings provided on the reservoir forming substrate.

A step occurs between the driver IC and the piezoelectric elements due to the thickness of the reservoir forming substrate, and it is necessary to electrically connect the driver IC and the piezoelectric elements through this step. Accordingly, in the liquid droplet ejecting head described in JP-A-2006-281763, the lateral surface of the reservoir forming substrate is an inclined surface, and the wirings which electrically connect the driver IC and the piezoelectric elements are formed on the inclined surface.

SUMMARY OF INVENTION

Technical Problem

On the other hand, in recent years, in order to realize image formation or manufacturing of wiring with higher definition, it is desirable to decrease the pitch between nozzles or to decrease the pitch between wirings. If the pitch between the nozzles or the pitch between the wirings decreases, accordingly, the pitch between terminals of the piezoelectric elements or between terminals of various elements decreases.

However, in the liquid droplet ejecting head described in JP-A-2006-281763, since the surface on which the wirings are formed is one lateral surface of the reservoir forming substrate, a minimum portion of the pitch between the wirings is the same as the pitch between the terminals of the piezoelectric elements. For this reason, if the pitch between the terminals of the piezoelectric elements decreases, there is a problem in that it is difficult to form the wirings.

Solution to Problem

An advantage of some aspects of the invention is to provide a wiring structure and a method of manufacturing a wiring structure capable of ensuring a sufficient pitch between a plurality of wirings in a wiring structure in which a plurality of terminals on a base substrate and the wirings on a wiring substrate bonded to the base substrate are electrically connected, and a liquid droplet ejecting head and a liquid droplet ejecting apparatus including the wiring structure.

A wiring structure according to an aspect of the invention includes a base substrate on which a plurality of first terminals are formed, a wiring substrate which is bonded to the base substrate, and has an inner wall having an inclined surface at an acute angle with respect to the base substrate and a through portion, a substrate which is bonded to the base substrate through the wiring substrate, and has a plurality of second terminals on the base substrate side, a control unit which is mounted on the substrate and is electrically connected to the plurality of second terminals, and a plurality of wirings which electrically connect the first terminals and the second terminals on the inclined surface.

Accordingly, it is possible to ensure a sufficient length of the wirings which are formed between the first terminals and the control unit (the sum of the length of the wirings which are formed on the wiring substrate and connect the first terminals and the second terminals and the length of the wirings which are formed on the substrate and connect the second terminals and the control unit). For this reason, it is possible to provide a wiring structure capable of ensuring a sufficient pitch between the plurality of wirings.

In the wiring structure according to the aspect of the invention, it is preferable that the control unit is mounted on the wiring substrate side of the substrate and is arranged in an area defined by the inner wall, the base substrate, and the substrate.

Accordingly, it is possible to achieve reduction in size (reduction in height) of the wiring structure.

In the wiring structure according to the aspect of the invention, it is preferable that the inner wall has a first inclined surface at an acute angle with respect to the base substrate, a second inclined surface at an acute angle with respect to the base substrate, and a plane which is located between the first inclined surface and the second inclined surface to connect the first inclined surface and the second inclined surface and is parallel to the base substrate.

Accordingly, since it is possible to extend the length of the inner wall, it is possible to ensure a sufficient pitch between the wirings.

In the wiring structure according to the aspect of the invention, it is preferable that an end portion of the wirings on the first terminal side overlaps the first terminals.

Accordingly, it is possible to perform electrical connection of the wirings and the first terminals simply and reliably.

In the wiring structure according to the aspect of the invention, it is preferable that the wirings are electrically connected to the first terminals through conductive connecting members. Accordingly, it is possible to perform electrical connection of the wirings and the first terminals simply and reliably.

In the wiring structure according to the aspect of the invention, it is preferable that the wirings extend from the inner wall to a mounting surface of the control unit of the substrate of the wiring substrate, and the wirings are electrically connected to the second terminals through conductive bumps between the wiring substrate and the substrate.

Accordingly, it is possible to perform electrical connection of the wirings and the second terminals simply and reliably.

In the wiring structure according to the aspect of the invention, it is preferable that the pitch between the plurality of second terminals is smaller than the pitch between the plurality of first terminals, and at least a part of the plurality of wirings has an extended portion which is inclined from the first terminal side on the inclined surface with a decreasing pitch from adjacent wirings with respect to an extension direction of the inclined surface, and an extended portion which extends from the second terminal side with a constant pitch from adjacent wirings in the extension direction of the inclined surface.

Accordingly, it is possible to regularly form the plurality of wirings while maintaining a sufficient pitch between the wirings.

In the wiring structure according to the aspect of the invention, it is preferable that the wiring substrate is bonded to the base substrate through an insulating adhesive.

Accordingly, a wiring structure having excellent mechanical strength is obtained.

In the wiring structure according to the aspect of the invention, it is preferable that the wiring substrate is made of silicon, and the inclined surface is formed along a crystal plane of silicon.

Accordingly, it is possible to form the wiring substrate simply with high precision.

A method of manufacturing a wiring structure according to another aspect of the invention includes bonding a wiring substrate, which has a through portion having an inner wall with an inclined surface at an acute angle with respect to a base substrate, to the base substrate, on which a plurality of first terminals are formed, and exposing the first terminals from the inclined surface into the through portion, forming a plurality of wirings which are electrically connected to the first terminals on the inner wall, and electrically connecting a plurality of second terminals of a substrate, on which a control unit is mounted and the plurality of second terminals electrically connected to the control unit are formed, and the wirings.

Accordingly, it is possible to simply manufacture a wiring structure capable of ensuring a sufficient pitch between the plurality of wirings.

A method of manufacturing a wiring structure according to still another aspect of the invention includes bonding a wiring substrate, which has a through portion having an inner wall with an inclined surface at an acute angle with respect to a base substrate, and has a plurality of wirings formed on the inclined surface, to the base substrate, on which a plurality of first terminals are formed, electrically connecting the first terminals and the wirings by conductive connecting members, and electrically connecting a plurality of second terminals of a substrate, on which a control unit is mounted and the plurality of second terminals electrically connected to the control unit are formed, and the wirings.

Accordingly, it is possible to simply manufacture a wiring structure capable of ensuring a sufficient pitch between the plurality of wirings.

A liquid droplet ejecting head according to yet another aspect of the invention includes the wiring structure according to the aspect of the invention.

Accordingly, a reliable liquid droplet ejecting head is obtained.

A liquid droplet ejecting apparatus according to still yet another aspect of the invention includes the liquid droplet ejecting head according to the aspect of the invention. Accordingly, a reliable liquid droplet ejecting apparatus is obtained.

DESCRIPTION OF EMBODIMENTS

Hereinafter, a wiring structure, a method of manufacturing a wiring structure, a liquid droplet ejecting head, and a liquid droplet ejecting apparatus according to the invention will be described in detail on the basis of preferred embodiments shown in the accompanying drawings.

First Embodiment

Figure 1:
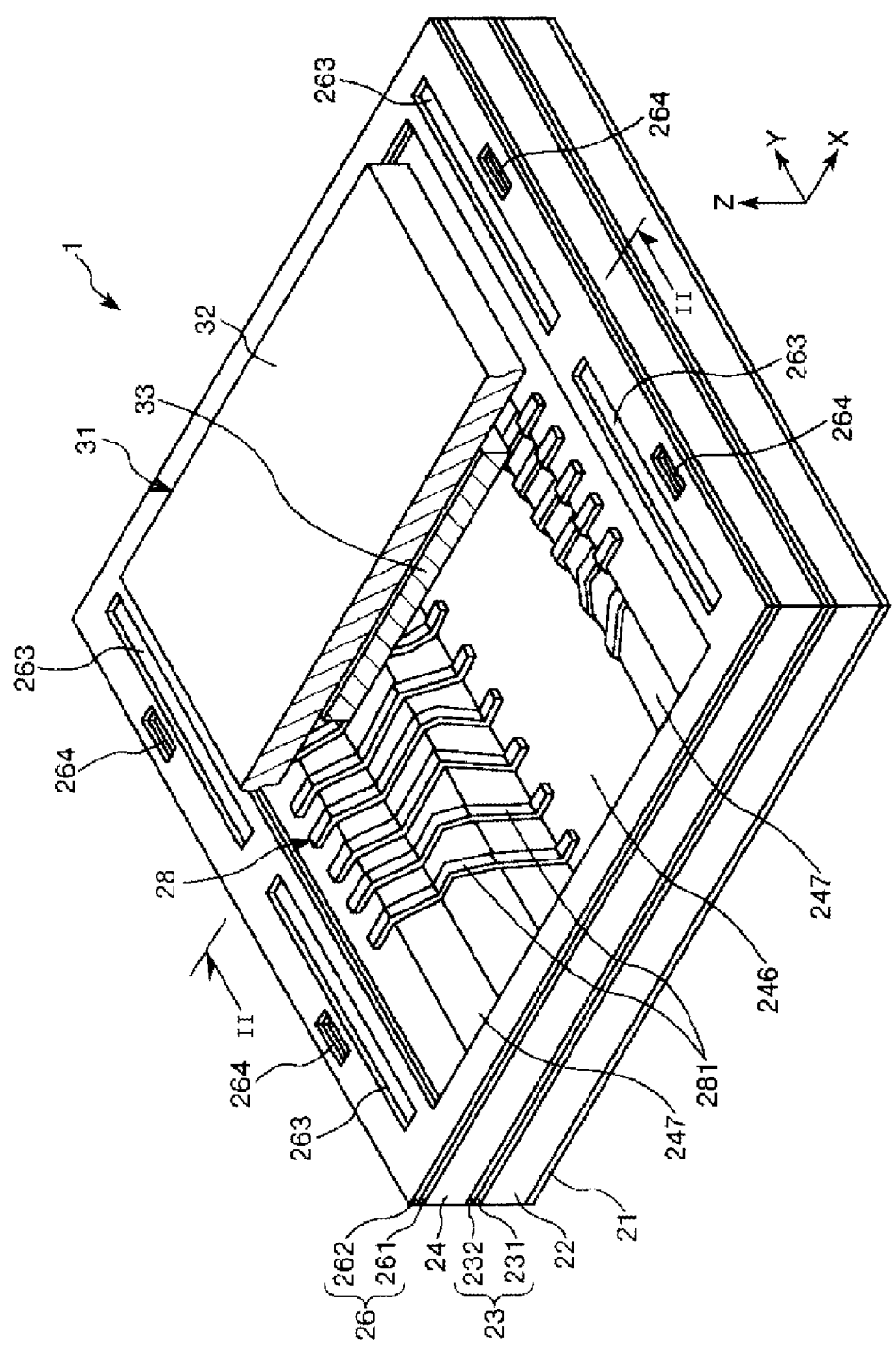
FIG. 1 is a perspective view showing a liquid droplet ejecting head (wiring structure) according to a first embodiment of the invention.
Figure 2:
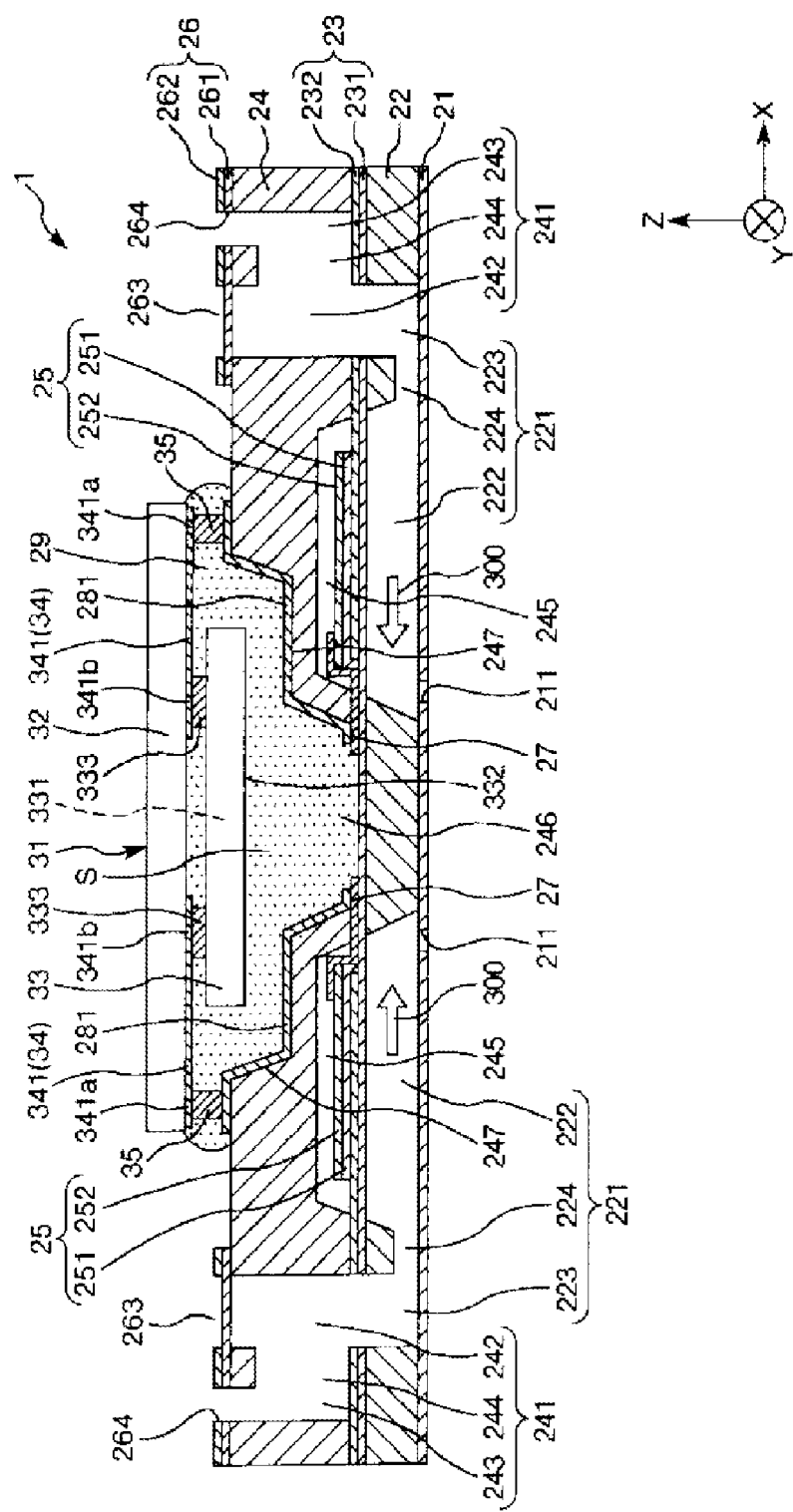
FIG. 2 is a sectional view taken along the line II-II of FIG. 1.
Figure 3:
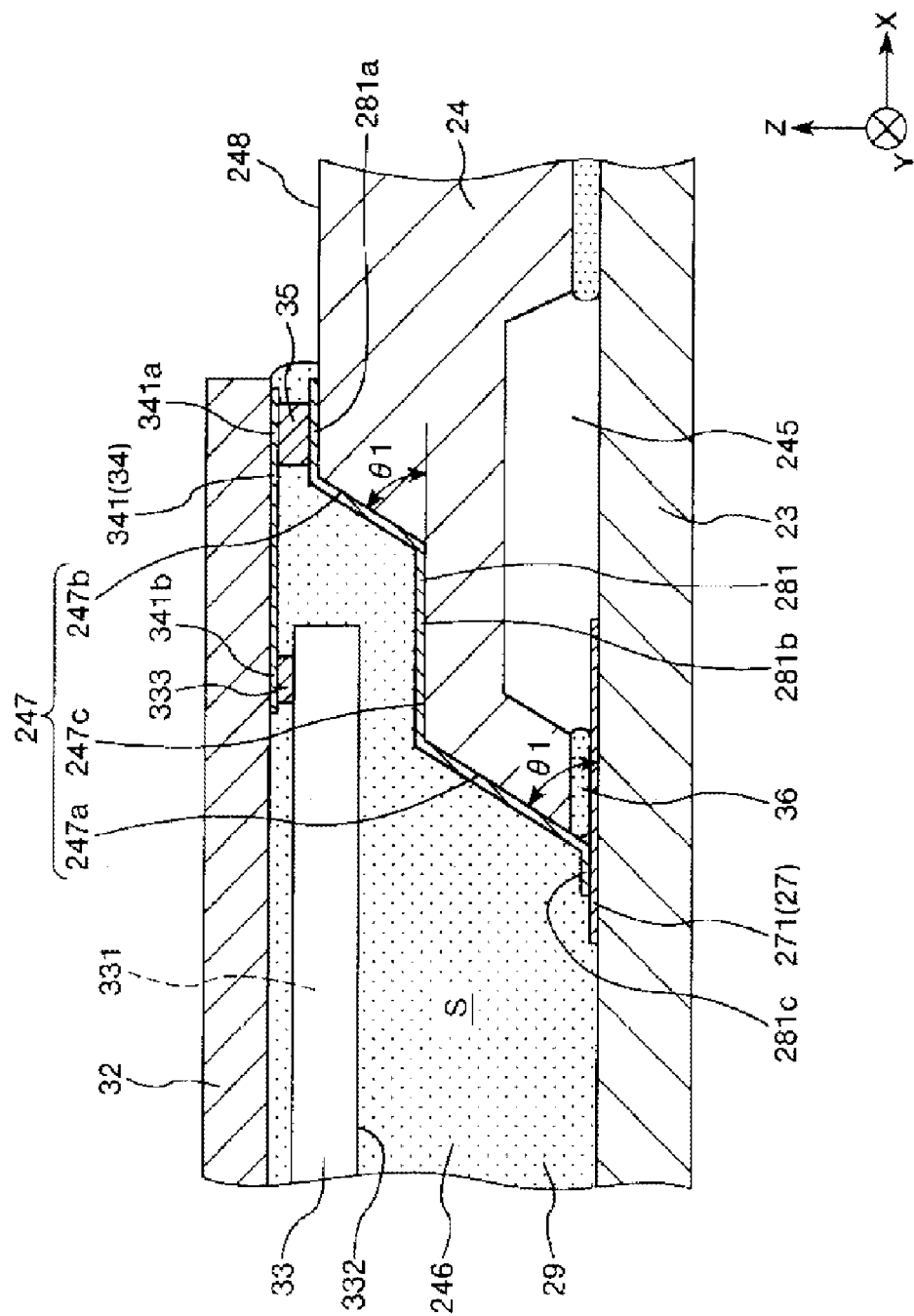
FIG. 3 is a sectional view illustrating a base substrate and a wiring substrate of the liquid droplet ejecting head shown in FIG. 1.
Figure 4:
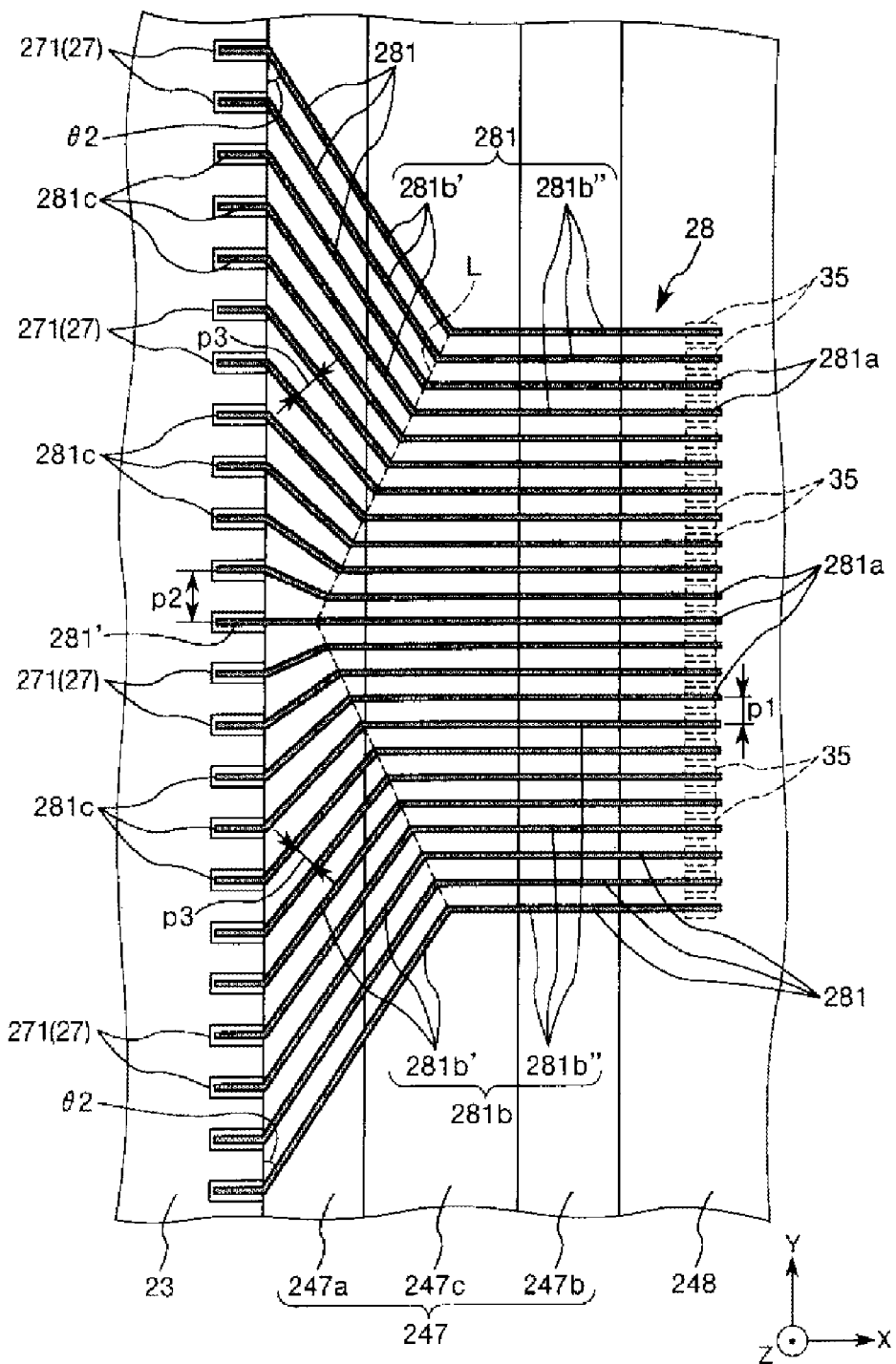
FIG. 4 is a plan view illustrating a wiring pattern of the liquid droplet ejecting head shown in FIG. 1.
Figure 5:
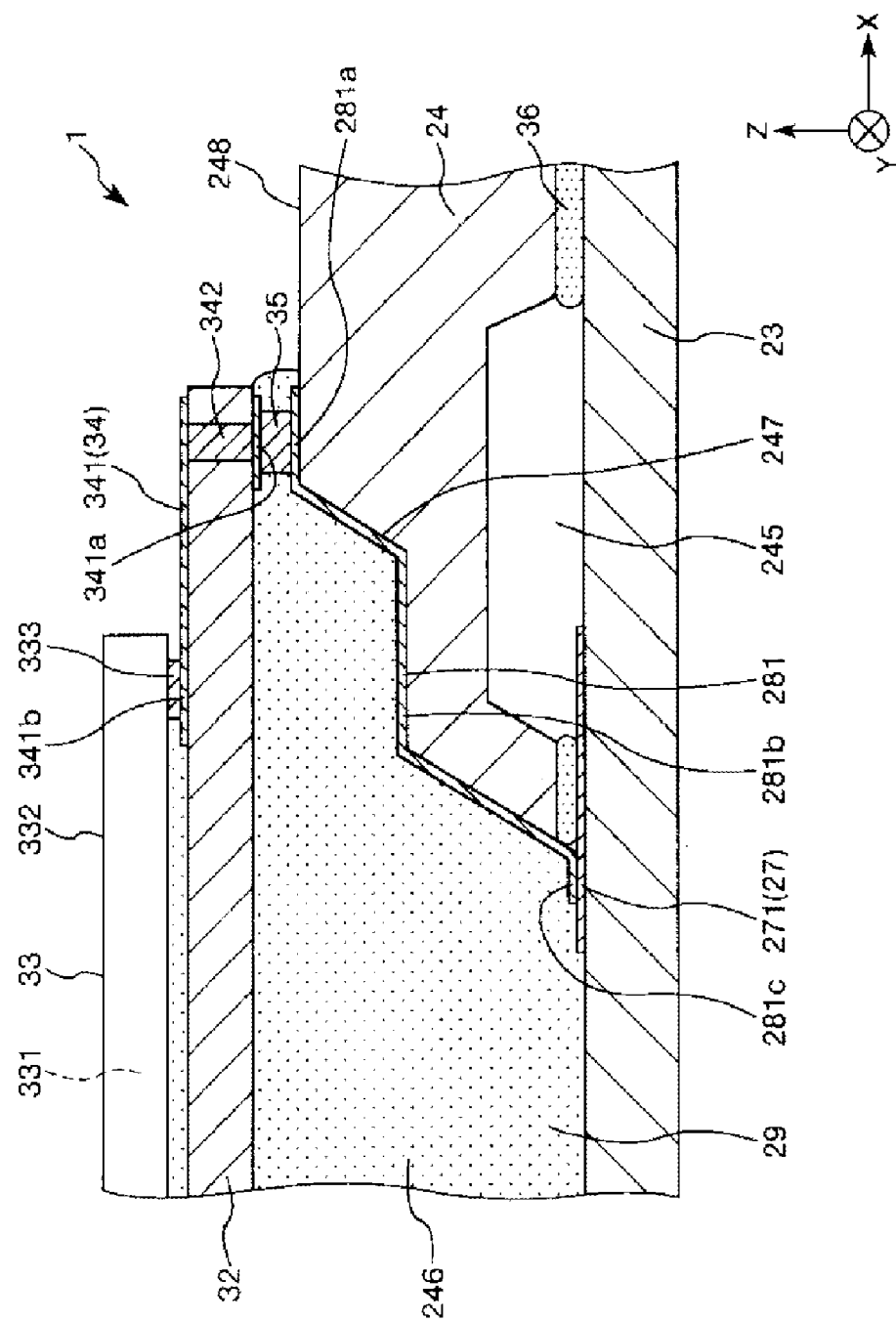
FIG. 5 is a sectional view showing a modification example of the liquid droplet ejecting head of FIG. 1.

FIG. 1 is a perspective view showing a liquid droplet ejecting head (wiring structure) showing a first embodiment of the invention. FIG. 2 is a sectional view taken along the line II-II of FIG. 1. FIG. 3 is a sectional view illustrating a base substrate and a wiring substrate of the liquid droplet ejecting head shown in FIG. 1. FIG. 4 is a plan view illustrating a wiring pattern of the liquid droplet ejecting head shown in FIG. 1. FIG. 5 is a sectional view showing a modification example of the liquid droplet ejecting head of FIG. 1. FIGS. 6A to 6C to FIG. 11 are sectional views illustrating a method of manufacturing the liquid droplet ejecting head shown in FIG. 1.

In FIGS. 1 to 5, for convenience of description, an X axis, a Y axis, and a Z axis are shown as three axes orthogonal to each other, the leading end side of each arrow shown in the drawings is referred to as "+(plus)", and the base end side of each arrow is referred to as "−(minus)". In the following description, the direction parallel to the X axis is referred to as "X-axis direction", the direction parallel to the Y axis is referred to as "Y-axis direction", and the direction parallel to the Z axis is referred to as "Z-axis direction". The +Z axis side is referred to as "upward", and the −Z axis side is referred to as "downward". FIGS. 5 to 11 are sectional views corresponding to the cross-section of FIG. 3.

A liquid droplet ejecting head (wiring structure) 1 shown in FIGS. 1 and 2 is used in a state of being mounted in, for example, a liquid droplet ejecting apparatus (printing apparatus) 100 described below. The liquid droplet ejecting head 1 has a nozzle substrate 21, a flow channel forming substrate 22, a vibrating plate (base substrate) 23, a reservoir forming substrate (wiring substrate) 24, a plurality of piezoelectric elements 25, a compliance substrate 26, and an IC mounting substrate 31.

The nozzle substrate 21, the flow channel forming substrate 22, the vibrating plate 23, the reservoir forming substrate 24, and the compliance substrate 26 are laminated in this order from below in FIG. 2. These substrates are bonded such that two adjacent substrates are bonded together by, for example, an adhesive, a thermal welding film, or the like.

In the liquid droplet ejecting head 1 having the above-described configuration, the piezoelectric elements 25 vibrate the vibrating plate 23 to change pressure in pressure generation chambers 222 of flow channels 221 formed in the flow channel forming substrate 22, such that ink 300 is ejected as liquid droplets from ejection ports 211 formed in the nozzle substrate 21.

Hereinafter, the respective units of the liquid droplet ejecting head 1 will be sequentially described in detail.

Nozzle Substrate

As shown in FIG. 2, in the nozzle substrate 21, the plurality of ejection ports (nozzles) 211 are formed to pass through the nozzle substrate 21 in the thickness direction. In this embodiment, the plurality of ejection ports 211 are arranged in a matrix. Specifically, the nozzle substrate 21 has an elongated shape in which the Y-axis direction is a longitudinal direction, and the plurality of ejection ports 211 are arranged in n rows (where n is an integer equal to or greater than one) in the longitudinal direction (Y-axis direction) of the nozzle substrate 21 and in two columns in the width direction (X-axis direction).

A constituent material of the nozzle substrate 21 is not particularly limited, and for example, a silicon material or stainless steel is preferably used. Since these materials are excellent in chemical resistance, even if the nozzle substrate 21 is exposed to the ink 300 for a long time, it is possible to reliably prevent the nozzle substrate 21 from being degenerated or deteriorated. Since these materials are excellent in processability, the nozzle substrate 21 with high dimensional precision is obtained. For this reason, the reliable liquid droplet ejecting head 1 is obtained.

The nozzle substrate 21 can be obtained by forming the ejection ports 211 in a substrate made of the above-described materials by etching, laser processing, or the like.

Flow Channel Forming Substrate

In the flow channel forming substrate 22, the flow channel 221 through which the ink 300 passes toward each ejection port 211 is formed. As shown in FIG. 2, the flow channel 221 has the plurality of pressure generation chambers 222, a relay chamber 223 (communicating portion), and a plurality of communicating channels 224 (supply channels) which communicate the plurality of pressure generation chambers 222 with the relay chamber 223.

The plurality of pressure generation chambers 222 are provided corresponding to the plurality of ejection ports 211. In this embodiment, the plurality of pressure generation chambers 222 are arranged in n rows (where n is an integer equal to or greater than one) in the Y-axis direction and in two columns in the X-axis direction corresponding to the plurality of ejection ports 211.

The relay chamber 223 is provided on the upstream side in the flow direction of the ink 300 with respect to the pressure generation chambers 222. The communicating channels 224 are provided between the pressure generation chambers 222 and the relay chamber 223.

A constituent material of the flow channel forming substrate 22 is not particularly limited, and for example, the same constituent material as the nozzle substrate 21 may be used. The flow channel forming substrate 22 can be obtained by forming the flow channels 221 in a substrate made of the above-described materials by etching.

Vibrating Plate

The vibrating plate 23 is configured to vibrate in the thickness direction. A part of the vibrating plate 23 faces the pressure generation chambers 222. That is, a part of the vibrating plate 23 constitutes a part of a wall portion which partitions the pressure generation chambers 222. Accordingly, the vibrating plate 23 vibrates to change pressure in the pressure generation chambers 222, whereby the ink 300 can be ejected as liquid droplets from the pressure generation chambers 222 through the ejection ports 211.

The vibrating plate 23 has an elastic film 231 and a lower electrode film 232 laminated in order from the flow channel forming substrate 22 side.

The elastic film 231 is constituted by, for example, a silicon oxide film having a thickness of about 1 to 2 micrometers. The lower electrode film 232 is constituted by, for example, a metal film having a thickness of about 0.2 micrometers. The lower electrode film 232 also functions as a common electrode of the plurality of piezoelectric elements 25.

The configuration of the lower electrode film 232 is not particularly limited insofar as the constituent material is conductive, and for example, various metal materials, such as Ni, Cr, Au, Pd, Ti, W, and Cu, and an alloy thereof may be used. As a specific configuration of the lower electrode film 232, for example, a configuration in which an electrode layer made of Au (or Au-based alloy) is laminated on an underlayer made of a Ni—Cr-based alloy or a configuration in which an electrode layer made of Cu (or Cu-based alloy) is laminated on an underlayer made of a Ti—W-based alloy is made.

Reservoir Forming Substrate

As shown in FIG. 3, the reservoir forming substrate 24 is bonded to the vibrating plate 23 through an insulating adhesive 36. Accordingly, it is possible to achieve improvement of mechanical strength of the liquid droplet ejecting head 1. Here, it is preferable that the adhesive 36 is provided to protrude inside through portions 246 described below. The thickness of the adhesive 36 is not particularly limited, and for example, is preferably about 1 micrometers. As the adhesive 36, any material may be used insofar as the material has adhesiveness that can bond the reservoir forming substrate 24 and the vibrating plate 23 together, and for example, a resin composition including a resin material (in particular, hardening resin) may be used. The resin composition may contain an insulating filler.

In the reservoir forming substrate 24, a plurality of reservoirs 241 which temporarily store the ink 300 are formed to communicate with the plurality of flow channels 221 of the above-described flow channel forming substrate 22. As shown in FIG. 2, each reservoir 241 has a first chamber (reservoir portion) 242, a second chamber (introduction channel) 243, and a communicating channel 244 which communicates the first chamber 242 with the second chamber 243.

The first chamber 242 communicates with the relay chamber 223 of each flow channel 221 of the flow channel forming substrate 22. The vibrating plate 23 is cut between the first chamber 242 and the relay chamber 223, and accordingly, the first chamber 242 communicates with the relay chamber 223. The second chamber 243 is provided on the upstream side in the flow direction of the ink 300 with respect to the first chamber 242. The communicating channel 244 is provided between the first chamber 242 and the second chamber 243. In the liquid droplet ejecting head 1, it can be said that the relay chamber 223 constitutes a part of the reservoir 241.

In the reservoir forming substrate 24, piezoelectric element storage chambers 245 which store the plurality of piezoelectric elements 25 are formed. The piezoelectric element storage chambers 245 are formed separately from the reservoirs 241.

In the reservoir forming substrate 24, the through portion 246 which passes through the reservoir forming substrate 24 in the thickness direction is formed. The through portion 246 functions as a storage space S which stores the IC package 33. A pair of inner walls 247 which face each other in the X-axis direction of the through portion 246 are inclined with respect to the plate surface (XY plane), and each have a first inclined surface 247a and a second inclined surface 247b at an acute angle with respect to the vibrating plate 23, and a plane 247c which connects the first and second inclined surfaces 247a and 247b, and is substantially parallel to the plate surface (vibrating plate 23). The first inclined surface 247a is connected to the lower surface of the reservoir forming substrate 24 at the lower end and is connected to the plane 247c at the upper end. The second inclined surface 247b is connected to the upper surface of the reservoir forming substrate 24 at the upper end and is connected to the plane 247c at the lower end.

The width (the length in the X-axis direction) of the first inclined surface 247a is not particularly limited, and is preferably equal to or greater than about 50 micrometers and equal to or smaller than about 200 micrometers, more preferably, equal to or greater than about 100 micrometers and equal to or smaller than about 150 micrometers. The width of the second inclined surface 247b is not particularly limited, and is preferably equal to or greater than about 50 micrometers and equal to or smaller than about 200 micrometers, more preferably, equal to or greater than about 100 micrometers and equal to or smaller than about 150 micrometers. The width of the plane 247c is not particularly limited, and is preferably equal to or greater than about 500 micrometers and equal to or smaller than about 1500 micrometers, more preferably, equal to or greater than about 700 micrometers and equal to or smaller than about 1000 micrometers. Accordingly, it is possible to appropriately increase the width of the inner wall 247, and as described below, the formation of a wiring pattern 28 is facilitated.

An angle theta1 of the first and second inclined surfaces 247a and 247b with respect to the plate surface is not particularly limited, and is preferably about 50 to 60 degrees, more preferably, about 54 to 55 degrees. Accordingly, it is possible to perform the formation of the wiring pattern 28 described below accurately and easily while appropriately suppressing the width of the inner wall 247. If the angle theta1 is less than the lower limit value, the width of the inner wall 247 increases too much depending on the height of the through portion 246, causing an excessive increase in size of the liquid droplet ejecting head 1. If the angle theta1 exceeds the upper limit value, the angle is too obtuse, making it difficult to form the wiring pattern 28 depending on a method of manufacturing the liquid droplet ejecting head 1 or the like.

A plurality of strip-shaped wirings 281 are formed on and near the inner wall 247, and the plurality of wirings 281 constitute the wiring pattern 28 which electrically connects the IC package 33 and the plurality of piezoelectric elements 25.

It is preferable that the reservoir forming substrate 24 is made of silicon, and the first and second inclined surfaces 247a and 247b are formed along a crystal plane of silicon. Accordingly, it is possible to form the first and second inclined surfaces 247a and 247b with high dimensional precision. For example, if a silicon substrate having a (100) plane orientation is subjected to wet etching (anisotropic etching) using an etching solution, such as KOH or nitric acid, to form the first and second inclined surfaces 247a and 247b of the reservoir forming substrate 24, each of the first and second inclined surfaces 247a and 247b can be constituted by a (111) plane of silicon, and the angle theta1 can be about 54.7 degrees. However, the reservoir forming substrate 24 may not be made of silicon, or may be made of, for example, an insulating material, such as a glass material.

On the surface (at least the surface on which the wiring pattern 28 is formed) of the reservoir forming substrate 24 having the above-described configuration, an insulating film (not shown) is formed. For example, if the reservoir forming substrate 24 is made of silicon, a silicon oxide film can be formed as an insulating film by thermal oxidation. The insulating film is formed, whereby it is possible to prevent short-circuiting between the wirings 281.

Piezoelectric Element

As shown in FIG. 2, the plurality of piezoelectric elements 25 are arranged between the flow channel forming substrate 22 and the reservoir forming substrate 24 (the piezoelectric element storage chamber 245). The plurality of piezoelectric elements 25 are provided corresponding to the plurality of ejection ports 211 and the plurality of pressure generation chambers 222.

Each piezoelectric element 25 has a piezoelectric film 251 and an upper electrode film 252 laminated in order from the lower electrode film 232 side. As described above, since the lower electrode film 232 also functions as the common electrode of the plurality of piezoelectric elements 25, it can be said that the plurality of piezoelectric elements 25 are constituted by the lower electrode film 232, a plurality of piezoelectric films 251, and a plurality of upper electrode films 252. Terminals (first terminals) 27 are electrically connected to the respective upper electrode films 252. Each terminal 27 extends from the upper electrode film 252 onto the elastic film 231 of the vibrating plate 23 through the lateral surface of the piezoelectric film 251. An end portion 271 of the terminal opposite to the upper electrode film 252 faces the above-described through portion 246 of the reservoir forming substrate 24.

In each piezoelectric element 25, a voltage is applied between the upper electrode film 252 and the lower electrode film 232, whereby the piezoelectric film 251 is deformed by a piezoelectric effect. The deformation can cause the vibrating plate 23 to vibrate in the thickness direction.

The configuration of the upper electrode films 252 and the terminals 27 is not particularly limited insofar as the constituent materials are conductive, and various metal materials, such as Ni, Cr, Au, Pd, Ti, W, and Cu, and an alloy thereof may be used. As a specific configuration of the upper electrode films 252 and the terminals 27, for example, a configuration in which an electrode layer made of Au (or Au-based alloy) is laminated on an underlayer made of a Ni—Cr-based alloy, or a configuration in which an electrode layer made of Cu (or Cu-based alloy) is laminated on an underlayer made of a Ti—W-based alloy is made.

Compliance Substrate

The compliance substrate 26 has a seal film 261 and a fixed plate 262 laminated in order from the reservoir forming substrate 24 side.

The seal film 261 is made of a flexible material (for example, a polyphenylene sulfide film having a thickness of about 6 micrometers). Apart of the seal film 261 faces the reservoir 241. The fixed plate 262 is made of a comparatively hard material (for example, stainless steel having a thickness of about 30 micrometers), such as a metal material. In the fixed plate 262, a region corresponding to a portion of the seal film 261 which faces the reservoir 241 is cut to form a cut portion 263.

In the compliance substrate 26, an introduction port 264 is formed to collectively pass through the seal film 261 and the fixed plate 262. The introduction port 264 is a portion which communicates with the reservoir 241 and introduces the ink 300 to the reservoir 241.

IC Mounting Substrate

The IC mounting substrate 31 has a substrate 32, and an IC package (control unit) 33 which is mounted on the substrate 32. On the lower surface of the substrate 32, a wiring pattern 34 having a plurality of wirings 341 is formed. The plurality of wirings 341 are provided corresponding to the plurality of wirings 281. Each wiring 341 is electrically connected to the corresponding wiring 281 by a terminal (second terminal) 341a provided in one end portion, and is electrically connected to the IC package 33 by a terminal 341b provided in the other end portion. The connection of the terminals 341a and the wirings 281 is performed through conductive bumps 35 provided between the substrate 32 and the reservoir forming substrate 24.

A constituent material of the bumps 35 is not particularly limited, and for example, various solder materials (solder), such as tin-lead series, tin-silver series, tin-zinc series, tin-bismuth series, tin-antimony series, tin-silver-bismuth series, tin-copper series, tin-silver-copper series, or gold may be used.

The substrate 32 is provided so as to cover the wiring pattern from the upper surface side of the reservoir forming substrate 24. An adhesive (filler) 29 is filled between the substrate 32 and the reservoir forming substrate 24. Accordingly, the substrate 32 can be fixed to the reservoir forming substrate 24, and the wiring pattern 28 can be blocked from the outside and protected. As a result, it is possible to prevent corrosion, deterioration, or the like of the wiring pattern 28.

As shown in FIG. 2, the IC package 33 is mounted on the lower surface of the substrate 32, and is stored in a space (in a space defined by the through portion 246, the substrate 32, and the vibrating plate 23) in the through portion 246. In this way, the IC package 33 is stored in the through portion 246, since the IC package 33 is prevented from protruding to the outside, it is possible to achieve reduction in size (in particular, reduction in height) of the liquid droplet ejecting head 1. In particular, as described above, since each inner wall 247 of the through portion 246 has the plane 247c halfway, it is possible to ensure a space for storing the IC package 33 in the through portion 246 while suppressing the horizontal width and height of the through portion 246. For this reason, it is possible to more effectively achieve reduction in size of the liquid droplet ejecting head 1.

The IC package 33 has a function of driving the plurality of piezoelectric elements 25. As shown in FIGS. 2 and 3, the IC package 33 has an electronic circuit (semiconductor device) 331, a casing (package) 332 which stores the electronic circuit 331, and a plurality of terminals 333 which protrude from the casing 332 and are electrically connected to the electronic circuit 331. The IC package 33 is fixed to the substrate 32 through the plurality of terminals 333, and is electrically connected to the plurality of wirings 341 through the plurality of terminals 333.

The electronic circuit 331 is constituted by, for example, a semiconductor, and includes a drive circuit for driving the piezoelectric elements 25. The casing 332 has a small piece shape or a plate shape, and stores the electronic circuit 331 therein. A constituent material of the casing 332 is not particularly limited, and for example, various resin materials, various metal materials, ceramics, or the like may be used. A constituent material of the respective terminals 333 is not particularly limited, and for example, a metal material, such as gold or copper, having comparatively low electrical resistance may be used.

Wiring Pattern

The plurality of wirings 281 of the wiring pattern 28 are formed on and near the inner walls 247. Since the inner walls 247 turn toward the upper surface of the reservoir forming substrate 24, and the plurality of wirings 281 are provided on the surface toward the upper side of the reservoir forming substrate 24, it is possible to easily form the wirings 281 using vapor phase film deposition from the surface side.

As shown in FIGS. 1 and 4, the plurality of wirings 281 are formed to be arranged in the Y-axis direction. Each wiring 281 is formed so as to electrically connect the corresponding terminal 27 (end portion 271) and the bump 35. Each wiring 281 is formed on an upper surface (a mounting surface of the IC mounting substrate 31) 248 of the reservoir forming substrate 24, and has a terminal portion 281a which is connected to the corresponding bump 35, a connecting portion 281c which is formed on the terminal 27, and a wiring portion 281b which connects the terminal portion 281a and the connecting portion 281c, and is formed on the inner wall 247. That is, each wiring 281 is formed to extend from the upper surface of the reservoir forming substrate 24 to the terminal 27 through the inner wall 247, and thus electrically connect the corresponding terminal 27 and the bump 35. In this way, the terminal portion 281a is provided on the upper surface 248, whereby it is possible to perform electrical connection of the wiring 281 and the bump reliably and easily. The connecting portion 281c is provided on the terminal 27 (to overlap the terminal 27), whereby it is possible to perform electrical connection of the terminal 27 and the wiring 281 reliably and easily.

Here, in the liquid droplet ejecting head 1, since the pitch (the inter-center distance between the pair of adjacent terminals 333 in the Y-axis direction) between the terminals 333 of the IC package 33 is smaller than the pitch between the end portions 271 of the terminals 27, accordingly, a pitch p1 between the terminal portions 281a (the inter-center distance between the pair of adjacent terminal portions 281a in the Y-axis direction) of the plurality of wirings 281 is smaller than a pitch p2 between the connecting portions 281c (the inter-center distance between the pair of adjacent connecting portions 281c in the Y-axis direction). The pitch p1 is, for example, about 35 micrometers, and the pitch p2 is, for example, about 42 micrometers. For this reason, the plurality of wirings 281 are formed so as to be centralized from the connecting portions 281c to the terminal portions 281a.

Specifically, the wiring portion 281b of each wiring 281 (excluding a linear wiring 281' located at the center) has an inclined portion (extended portion) 281b' which extends from the connecting portion 281c to be inclined with respect to the extension direction (in the X-axis direction in XY plan view) of the inner wall 247, and a parallel portion (extended portion) 281b" which extends from the leading end of the inclined portion 281b' in the extension direction (X-axis direction) of the inner wall 247. The pitch between the wiring portions 281b in the inclined portion 281b' gradually decreases toward the upper surface 248 side, and the pitch between the wiring portions 281b in the parallel portion 281b" is substantially constant. A line L which connects the boundary of the inclined portion 281b' and the parallel portion 281b" of each wiring portion 281b substantially has a V shape having an angle in the central portion. The wirings 281 are configured as above, whereby it is possible to regularly form the plurality of wirings 281 while maintaining a sufficient pitch between the wirings 281.

As described above, the inner wall 247 has the first inclined surface 247a, the second inclined surface 247b, and the plane 247c, and is configured such that the width (the length in the X-axis direction) is sufficiently large. For this reason, it is possible to increase the length of the wiring 281 and to increase an angle theta2 between the wiring 281b (inclined portion 281b') and the Y axis in plan view of the inner wall 247. The angle theta2 increases, whereby it is possible to increase a pitch p3 between the inclined portions 281b' of the respective wirings 281. For this reason, it is possible to prevent short-circuiting between the plurality of wirings 281. As the pitch p3 increases, the formation of the wiring pattern 28 is facilitated, and the wiring pattern 28 can be formed with high precision. For this reason, the reliable liquid droplet ejecting head 1 is obtained.

The configuration of the respective wirings 281 is not particularly limited insofar as the constituent material is conductive, and for example, various metal materials, such as Ni, Cr, Au, Pd, Ti, W, and Cu, and an alloy thereof may be used. As a specific configuration of the respective wirings 281, for example, a configuration in which an electrode layer made of Au (or Au-based alloy) is laminated on an underlayer made of a Ni—Cr-based alloy or a configuration in which an electrode layer made of Cu (or Cu-based alloy) is laminated on an underlayer made of a Ti—W-based alloy is made.

A method of forming the respective wirings 281 is not particularly limited, and for example, various known film deposition methods may be used. For example, if the wiring 281 has a laminated structure of an underlayer and an electrode layer, the underlayer and the electrode layer may be formed by a vapor phase film deposition method, such as sputtering, or the underlayer may be formed by a vapor phase film deposition method, such as sputtering and the electrode layer may be formed by electroless plating.

The liquid droplet ejecting head 1 of this embodiment has been described. According to the liquid droplet ejecting head 1, since it is possible to ensure a sufficient length of the wirings 281, it is possible to ensure a sufficient pitch between the wirings 281.

Similarly to the plurality of wirings 281, the wiring pattern 34 having the plurality of wirings 341 formed on the lower surface of the substrate 32 on the IC mounting substrate 31 side may be formed with a decreasing wiring pitch from the terminals 341a toward the terminals 341b. Accordingly, in the IC package 33, since it is possible to further decrease the pitch between the plurality of terminals 333, it becomes possible to achieve cost reduction by reduction in size of the IC package.

In the liquid droplet ejecting head 1 of this embodiment, although a configuration in which the IC package 33 is mounted on the lower surface of the substrate 32 has been described, the configuration of the liquid droplet ejecting head 1 is not limited thereto, and for example, as shown in FIG. 5, the IC package 33 may be mounted on the upper surface of the substrate 32. In this case, the wirings 341 may be formed on the upper surface of the substrate 32 and may be extracted to the lower surface of the substrate 32 by through electrodes 342 formed in the substrate 32.

In the liquid droplet ejecting head 1 of this embodiment, although the wiring portion 281b of each wiring 281 (excluding the wiring 281') has the inclined portion 281b' and the parallel portion 281b", the configuration of each wiring portion 281b is not limited thereto, and for example, the wiring portion 281b may be constituted only by the inclined portion 281b' with no parallel portion 281b". In the liquid droplet ejecting head 1 of this embodiment, although the plurality of wirings 281 are formed so as to converge on the wiring 281' located at the center, the wiring pattern 28 is not limited thereto, and for example, the plurality of wirings 281 may be formed so as to converge on the wiring 281 located on one end side.

Next, a method of manufacturing the liquid droplet ejecting head 1 will be described.

The method of manufacturing the liquid droplet ejecting head 1 includes at least bonding the reservoir forming substrate 24, which has the through portion 246 having the inner walls 247 with the inclined surfaces, to a substrate 2300, on which the plurality of terminals 27 are formed, forming the plurality of wirings 281 which are electrically connected to the terminals 27 and are extracted to the upper surface 248 of the reservoir forming substrate 24 over the inner wall 247, and bonding the substrate 32, on which the IC package 33 is mounted and the plurality of terminals 341a electrically connected to the IC package 33 are formed, to the reservoir forming substrate 24, and electrically connecting the plurality of wirings 281 and the plurality of terminals 341a through the bumps 35. Hereinafter, this manufacturing method will be described in detail.

Figure 6A:
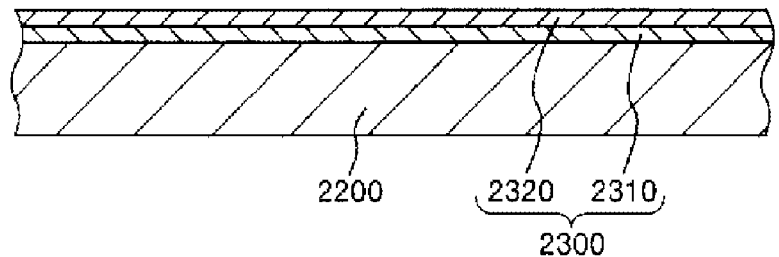
FIG. 6A is a sectional view illustrating a method of manufacturing the liquid droplet ejecting head shown in FIG. 1.
Figure 6B:
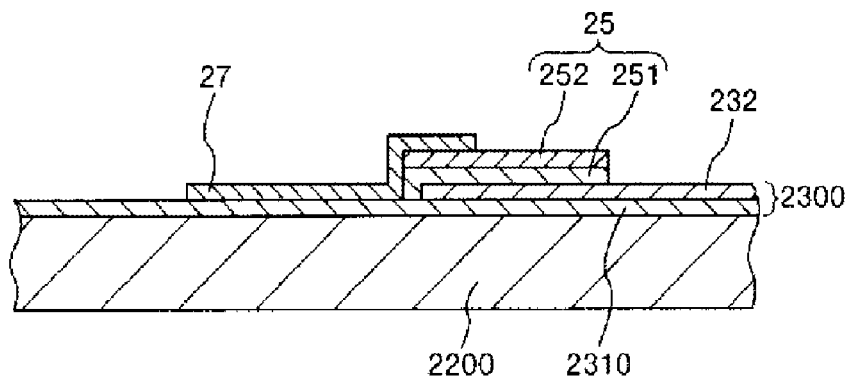
FIG. 6B is a sectional view illustrating a method of manufacturing the liquid droplet ejecting head shown in FIG. 1.
Figure 6C:
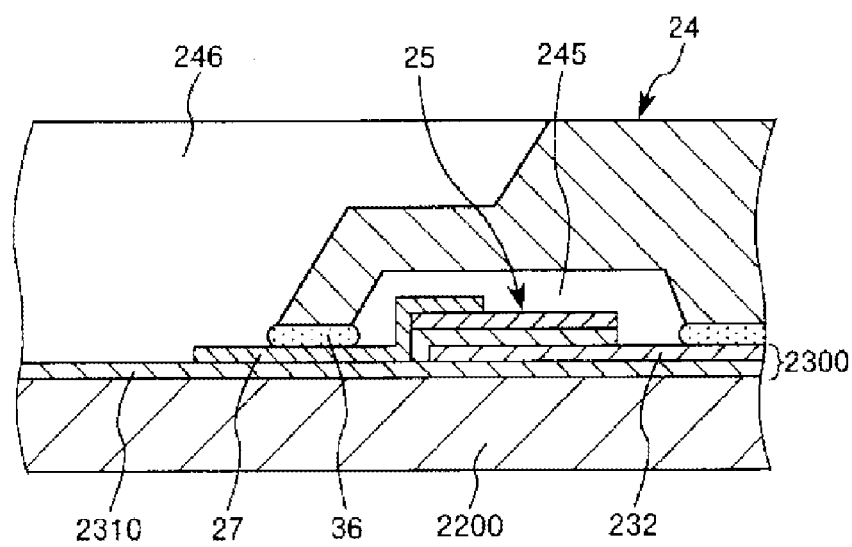
FIG. 6C is a sectional view illustrating a method of manufacturing the liquid droplet ejecting head shown in FIG. 1.

First, as shown in FIG. 6A, a laminate (base substrate) of the substrate 2300, which is constituted as a laminate of an elastic film 2310 and a lower electrode film 2320, and becomes the vibrating plate 23 later, and a substrate 2200, which becomes the flow channel forming substrate 22 later, is prepared. Next, as shown in FIG. 6B, the lower electrode film 2320 is patterned to form the lower electrode film 232, and thereafter, for example, the piezoelectric elements 25 and the terminals 27 are formed on the substrate 2300 using a photolithography technique and an etching technique. Next, as shown in FIG. 6C, the reservoir forming substrate 24 is prepared and is bonded to the upper surface of the substrate 2300 through the adhesive 36. At this time, the adhesive 36 is provided so as to protrude inside the through portion 246. In this state, the terminals 27 pass below the inner wall 247 and are exposed in the through portion 246.

Figure 7A:
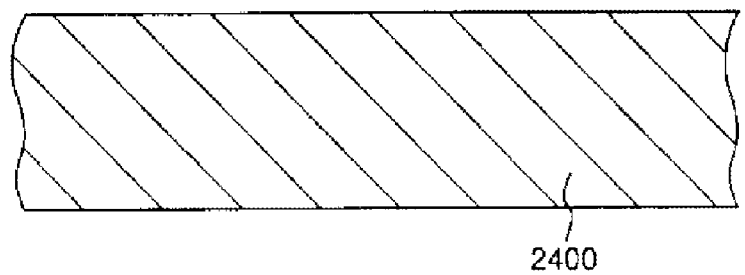
FIG. 7A is a sectional view illustrating a method of manufacturing the liquid droplet ejecting head shown in FIG. 1.
Figure 7B:
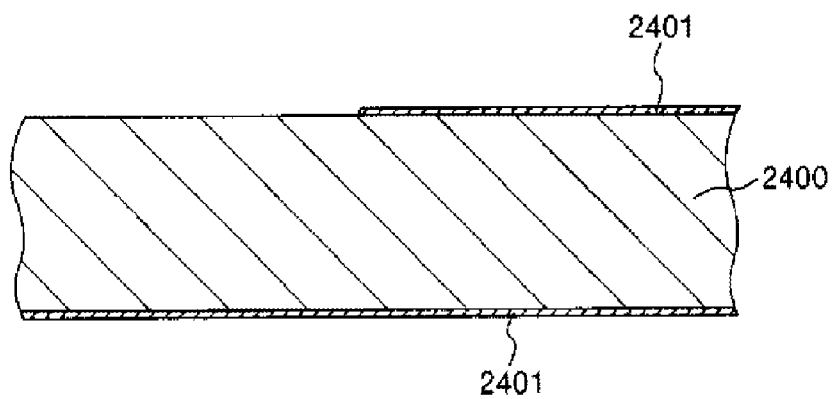
FIG. 7B is a sectional view illustrating a method of manufacturing the liquid droplet ejecting head shown in FIG. 1.
Figure 7C:
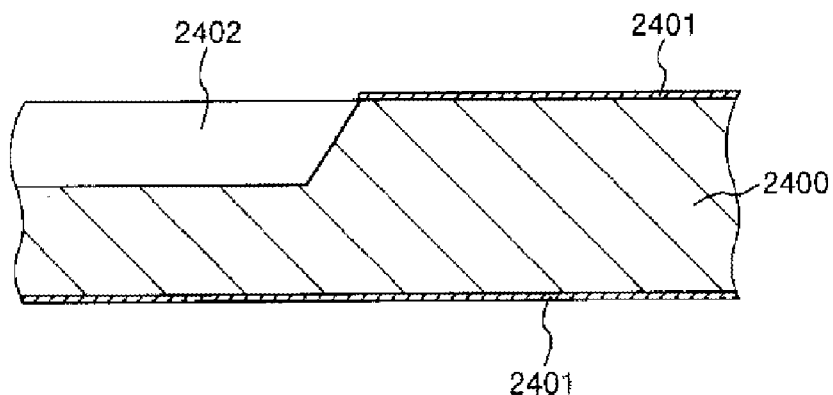
FIG. 7C is a sectional view illustrating a method of manufacturing the liquid droplet ejecting head shown in FIG. 1.
Figure 7D:
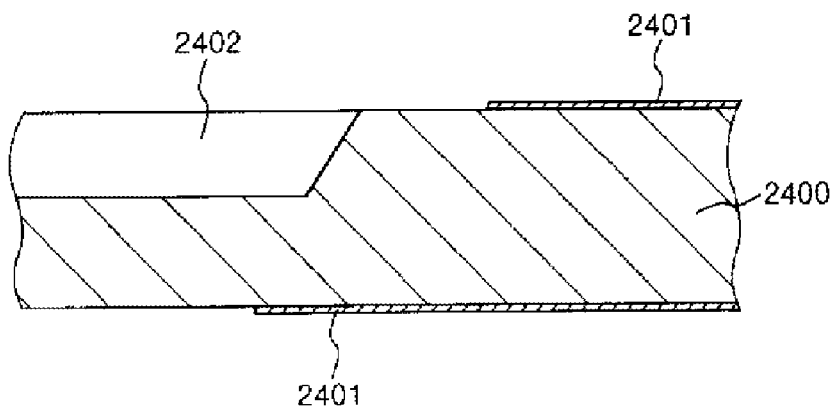
FIG. 7D is a sectional view illustrating a method of manufacturing the liquid droplet ejecting head shown in FIG. 1.
Figure 8A:
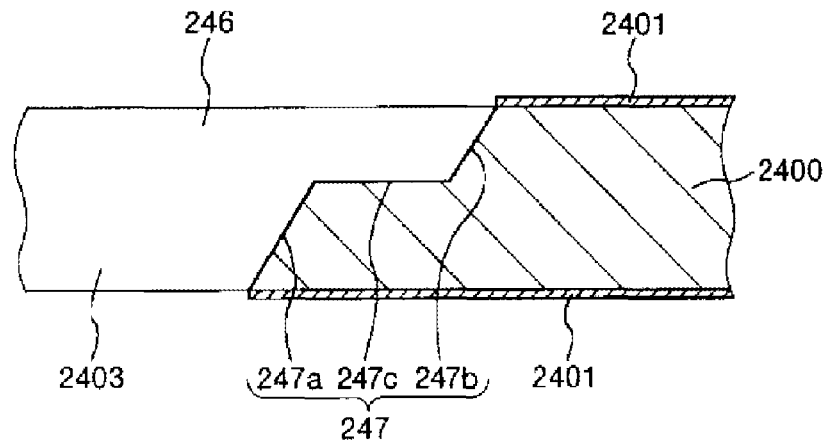
FIG. 8A is a sectional view illustrating a method of manufacturing the liquid droplet ejecting head shown in FIG. 1.

For example, the reservoir forming substrate 24 can be manufactured as follows. First, as shown in FIG. 7A, a silicon substrate 2400 having a (100) plane orientation is prepared. Next, as shown in FIG. 7B, the surface of the silicon substrate 2400 is thermally oxidized, a $SiO_2$ film 2401 is formed on the surface of the silicon substrate 2400, and a part of the $SiO_2$ film 2401 is removed using a photolithography technique and an etching technique. Next, as shown in FIG. 7C, for example, the silicon substrate 2400 is subjected to wet etching (half etching) using KOH with the $SiO_2$ film 2401 as a mask to form a bottomed concave portion 2402 which is opened to the upper surface. Next, as shown in FIG. 7D, a part of the $SiO_2$ film 2401 is further removed using a photolithography technique and an etching technique. Next, as shown in FIG. 8A, the silicon substrate 2400 is subjected to wet etching using KOH with the $SiO_2$ film 2401 as a mask to expand the lateral surface of the concave portion 2402 and to form a through hole 2403 which passes through the bottom surface of the concave portion 2402. Accordingly, the through portion 246 which has the inner walls 247 each having the first and second inclined surfaces 247a and 247b and the plane 247c is formed.

Figure 8B:
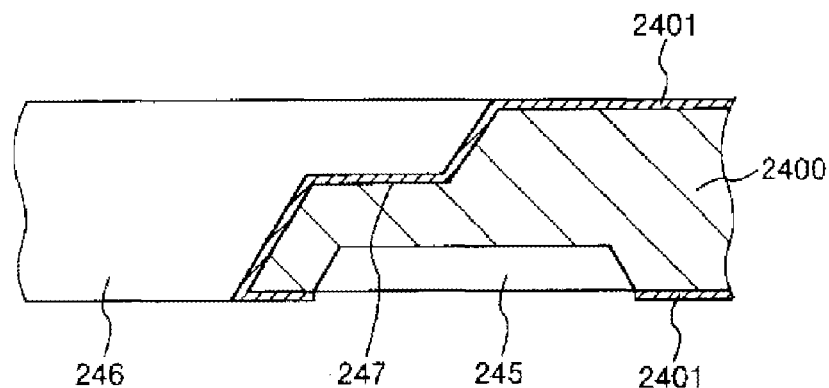
FIG. 8B is a sectional view illustrating a method of manufacturing the liquid droplet ejecting head shown in FIG. 1.
Figure 8C:
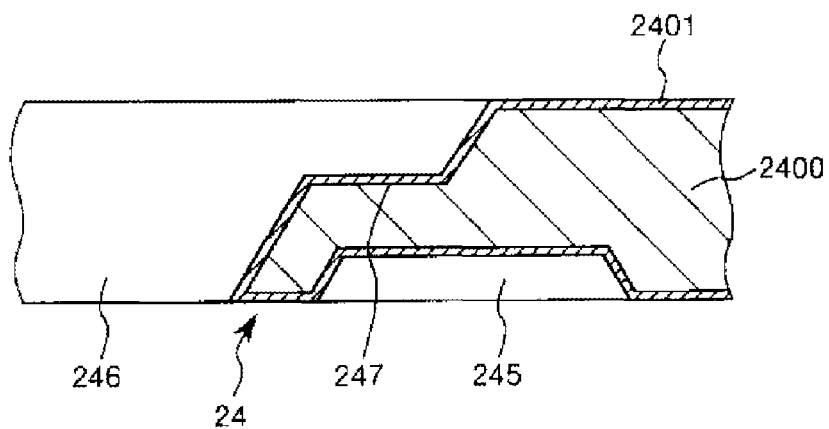
FIG. 8C is a sectional view illustrating a method of manufacturing the liquid droplet ejecting head shown in FIG. 1.

Next, as shown in FIG. 8B, for example, similarly to the formation of the above-described through portion 246, the reservoirs 241 (not shown) and the piezoelectric element storage chambers 245 are formed. Thereafter, the surface of the silicon substrate 2400 is thermally oxidized again, and the $SiO_2$ film 2401 is formed on the surface of the silicon substrate 2400, whereby the reservoir forming substrate 24 shown in FIG. 8C is obtained. According to this method, since the first and second inclined surfaces 247a and 247b are constituted by the (111) plane of silicon, the inclination with respect to the plate surface is about 54.7 degrees.

Figure 9A:
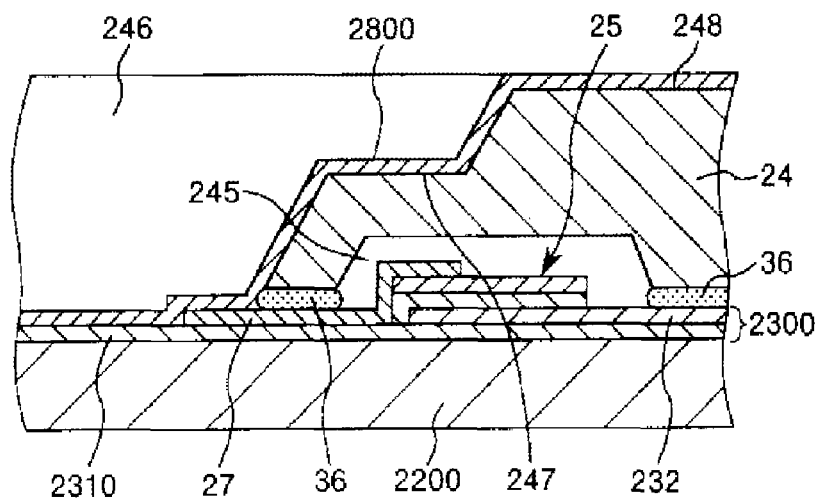
FIG. 9A is a sectional view illustrating a method of manufacturing the liquid droplet ejecting head shown in FIG. 1.
Figure 9B:
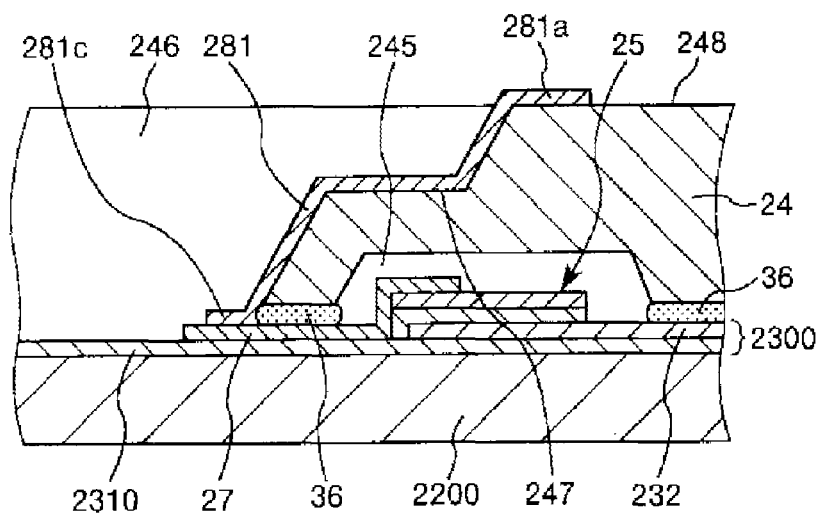
FIG. 9B is a sectional view illustrating a method of manufacturing the liquid droplet ejecting head shown in FIG. 1.

Next, as shown in FIG. 9A, for example, a metal film 2800 which becomes the wirings 281 later is formed on the upper surface 248 of the reservoir forming substrate 24, the inner walls 247, and the exposed portion of the elastic film 2310 in the through portion 246 by sputtering or the like. At this time, as described above, the adhesive 36 protrudes inside the through portion 246, and the metal film 2800 can be also formed on the surface of the adhesive 36, whereby it is possible to reliably form the metal film 2800 on the boundary of the inner walls 247 and the vibrating plate 23. For this reason, it is possible to effectively prevent disconnection of the wirings 281 in the boundary. The configuration of the metal film 2800 is not particularly limited, and for example, a laminate of a Ni—Cr alloy layer and an Au layer may be used. Next, the metal film 2800 is patterned using a photolithography technique and an etching technique, and thus, as shown in FIG. 9B, the plurality of wirings 281 are formed.

Figure 9C:
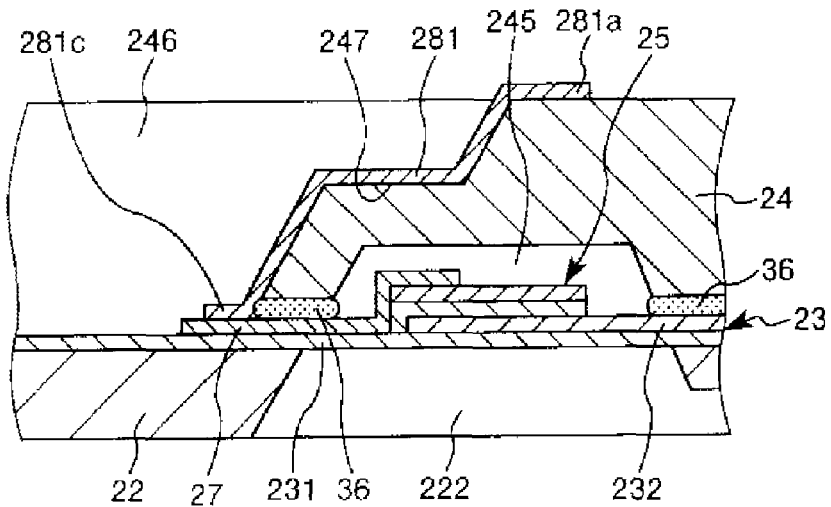
FIG. 9C is a sectional view illustrating a method of manufacturing the liquid droplet ejecting head shown in FIG. 1.
Figure 10A:
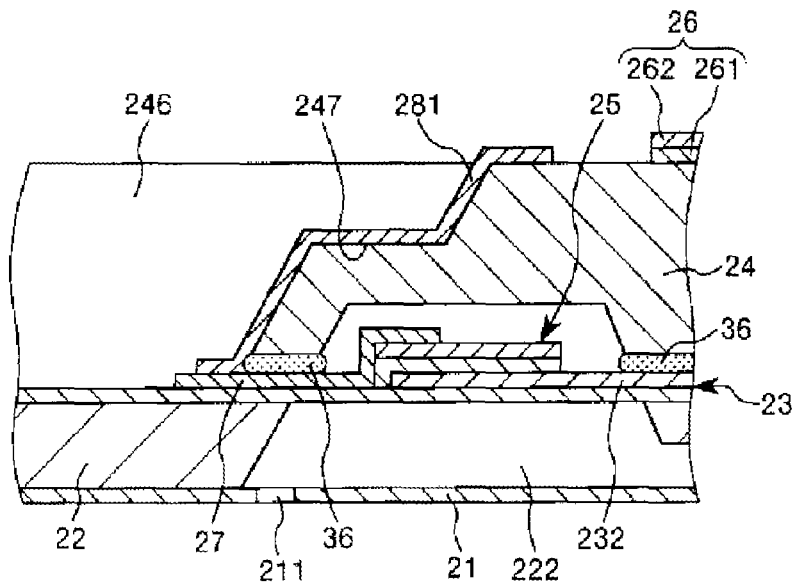
FIG. 10A is a sectional view illustrating a method of manufacturing the liquid droplet ejecting head shown in FIG. 1.
Figure 10B:
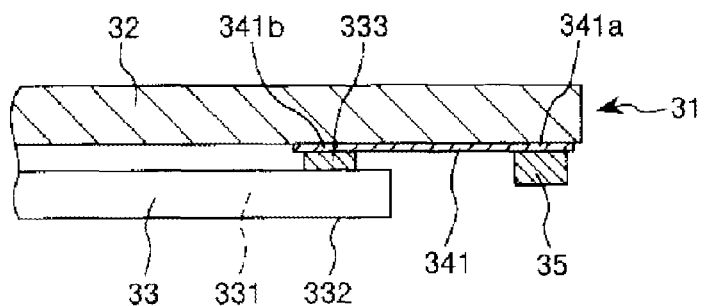
FIG. 10B is a sectional view illustrating a method of manufacturing the liquid droplet ejecting head shown in FIG. 1.
Figure 10C:
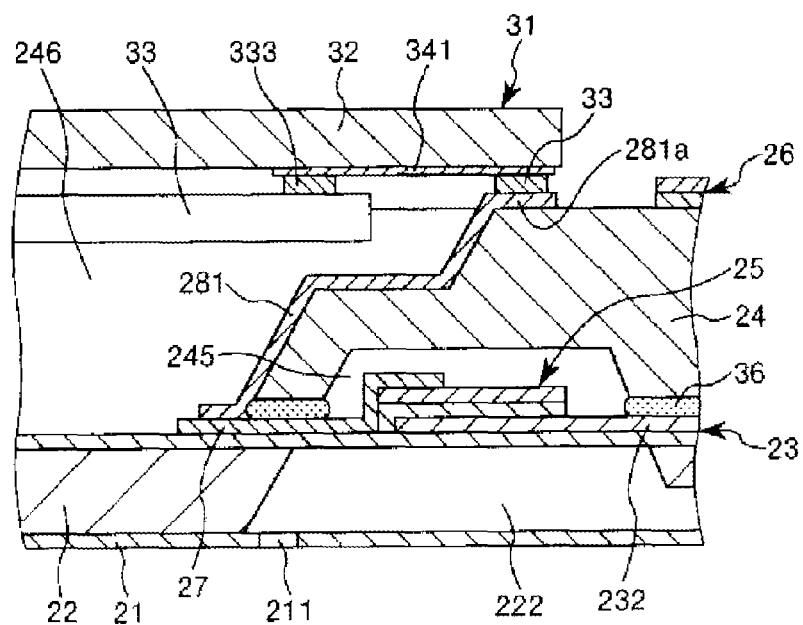
FIG. 10C is a sectional view illustrating a method of manufacturing the liquid droplet ejecting head shown in FIG. 1.
Figure 11:
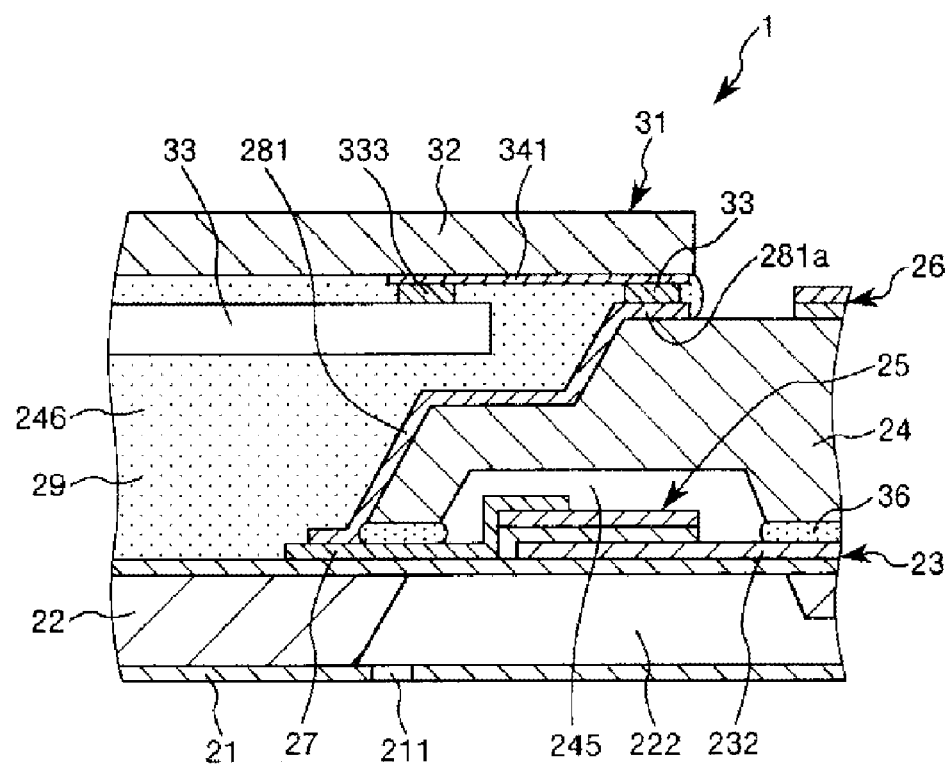
FIG. 11 is a sectional view illustrating a method of manufacturing the liquid droplet ejecting head shown in FIG. 1.

Next, as shown in FIG. 9C, the substrate 2200 and the elastic film 2310 are patterned in order using a photolithography technique and an etching technique, and thus, the vibrating plate 23 and the flow channel forming substrate 22 are obtained. Next, as shown in FIG. 10A, the nozzle substrate 21 is bonded to the lower surface of the flow channel forming substrate 22, and the compliance substrate 26 is bonded to the upper surface of the reservoir forming substrate 24. Next, as shown in FIG. 10B, the IC mounting substrate 31 with the bumps 35 is prepared, and as shown in FIG. 10C, the IC mounting substrate 31 is bonded to the reservoir forming substrate 24 through the bumps 35. Finally, as shown in FIG. 11, the through portion 246 is filled with the adhesive 29, whereby the liquid droplet ejecting head 1 is obtained.

According to the method of manufacturing the liquid droplet ejecting head 1, it is possible to form the reliable liquid droplet ejecting head 1.

Second Embodiment

Next, a second embodiment of the liquid droplet ejecting head according to the invention will be described.

Figure 12:
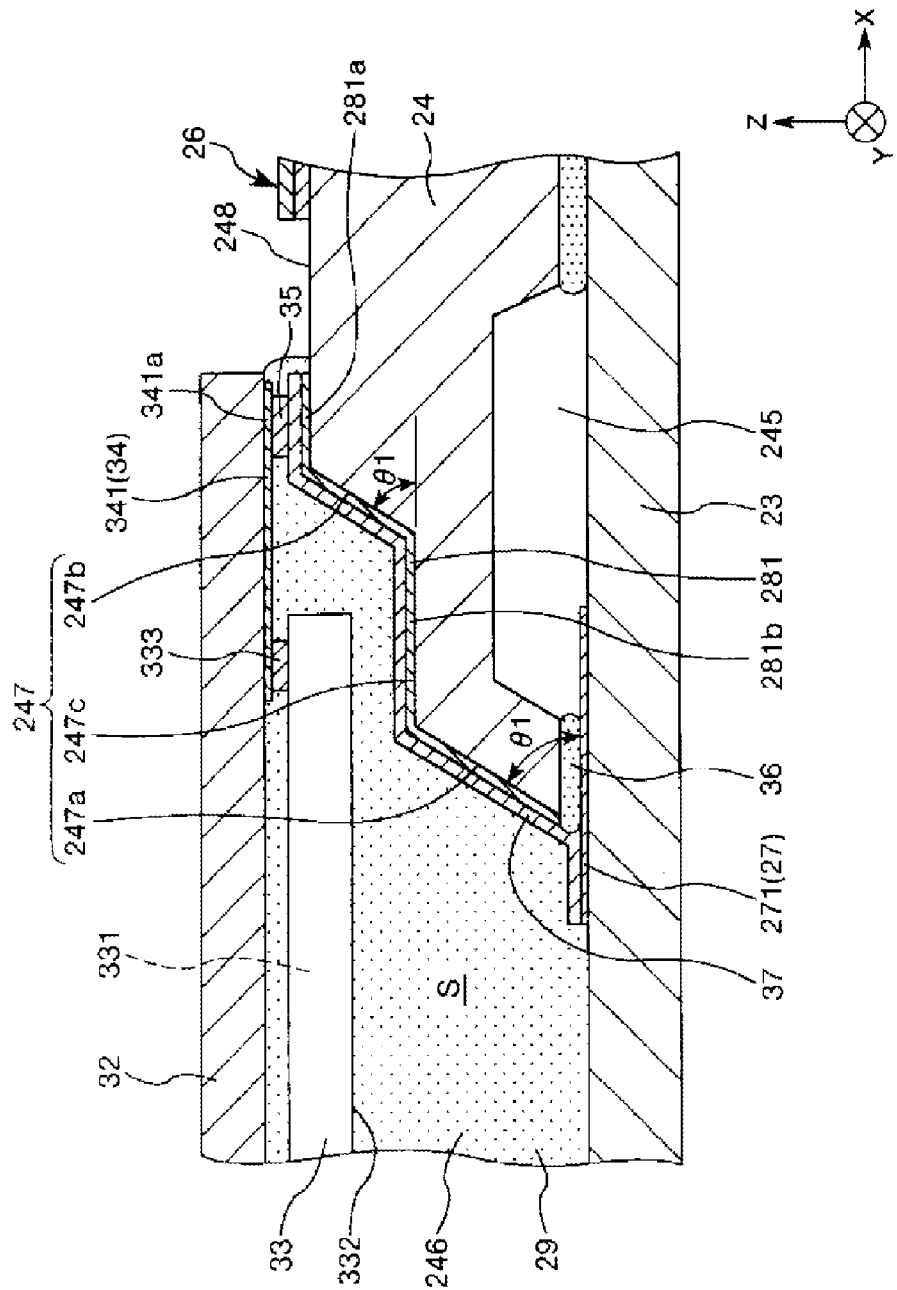
FIG. 12 is a sectional view illustrating a base substrate and a wiring substrate of a liquid droplet ejecting head according to a second embodiment of the invention.

FIG. 12 is a sectional view illustrating a base substrate and a wiring substrate of a liquid droplet ejecting head according to the second embodiment of the invention. FIGS. 13A to 13C to FIGS. 15A to 15C are sectional views illustrating a method of manufacturing the liquid droplet ejecting head shown in FIG. 12.

Hereinafter, the liquid droplet ejecting head of the second embodiment will be described focusing on a difference from the above-described first embodiment, and description on the same matters will not be repeated.

The liquid droplet ejecting head according to the second embodiment of the invention is the same as the above-described first embodiment, except that a method of connecting terminals and wirings is different. The same parts as those in the above-described first embodiment are represented by the same reference numerals.

As shown in FIG. 12, in the liquid droplet ejecting head 1 of this embodiment, the wiring 281 is formed only to the lower end portion of the inner wall 247 and is not in contact with the terminal 27. A conductive connecting member 37 is formed so as to extend over the wiring 281 and the terminal 27, and the terminal 27 and the wiring 281 are electrically connected together by the connecting member 37. With this configuration, as in the first embodiment, it is also possible to perform electrical connection of the terminal 27 and the wiring 281 reliably and easily. A constituent material of the connecting member 37 is not particularly limited insofar as the constituent material is conductive, and for example, various metal materials, such as Ni, Cr, Au, Pd, Ti, W, and Cu, may be used. A method of manufacturing the connecting member 37 is not particularly limited, and for example, an electroless plating method is preferably used. Accordingly, it is possible to easily form the connecting member 37.

Next, a method of manufacturing the liquid droplet ejecting head 1 of this embodiment will be described.

The method of manufacturing the liquid droplet ejecting head 1 includes at least bonding the reservoir forming substrate 24, which has the through portion 246 having the inclined surface at an acute angle with respect to the substrate 2300 as the inner wall 247, and has the plurality of wirings 281 extracted from the inner wall 247 to the upper surface 248, to the substrate 2300, on which the plurality of terminals 27 are formed, electrically connecting the terminals 27 and the wirings 281 by the connecting members 37, and bonding the substrate 32, on which the IC package 33 is mounted, to the reservoir forming substrate 24 from an opposite side to the substrate 2300, and electrically connecting the plurality of wirings 281 and the plurality of terminals 341a. Hereinafter, this method of manufacturing the liquid droplet ejecting head 1 will be described in detail.

Figure 13A:
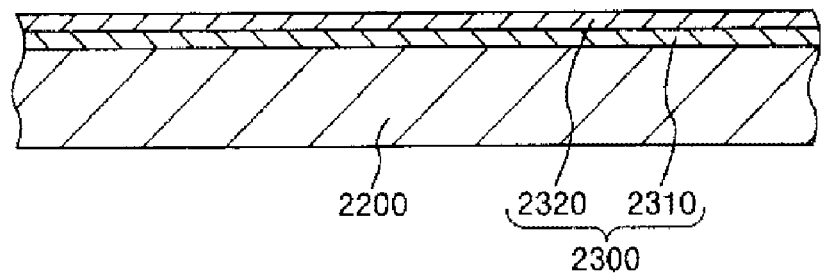
FIG. 13A is a sectional view illustrating a method of manufacturing the liquid droplet ejecting head shown in FIG. 12.
Figure 13B:
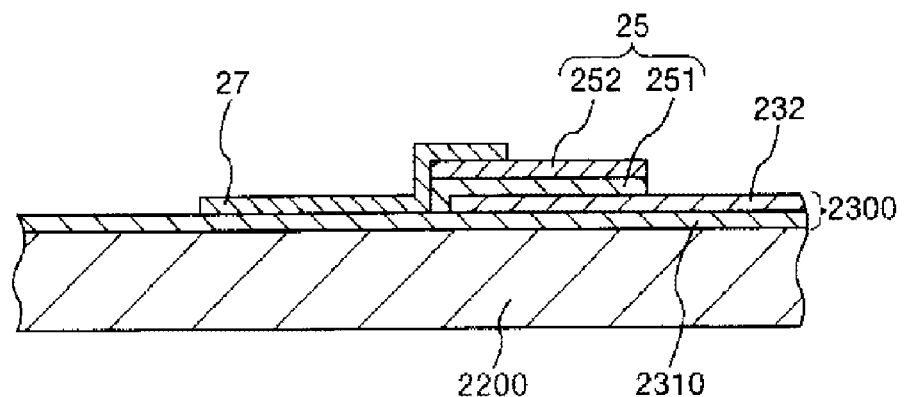
FIG. 13B is a sectional view illustrating a method of manufacturing the liquid droplet ejecting head shown in FIG. 12.

First, as shown in FIG. 13A, a laminate of a substrate 2300, which is constituted as a laminate of an elastic film 2310 and a lower electrode film 2320, and becomes the vibrating plate 23 later, and a substrate 2200, which becomes the flow channel forming substrate 22 later, is prepared. Next, as shown in FIG. 13B, the lower electrode film 2320 is patterned to form the lower electrode film 232, and the piezoelectric elements 25 and the terminals 27 are formed on the substrate 2300.

Figure 13C:
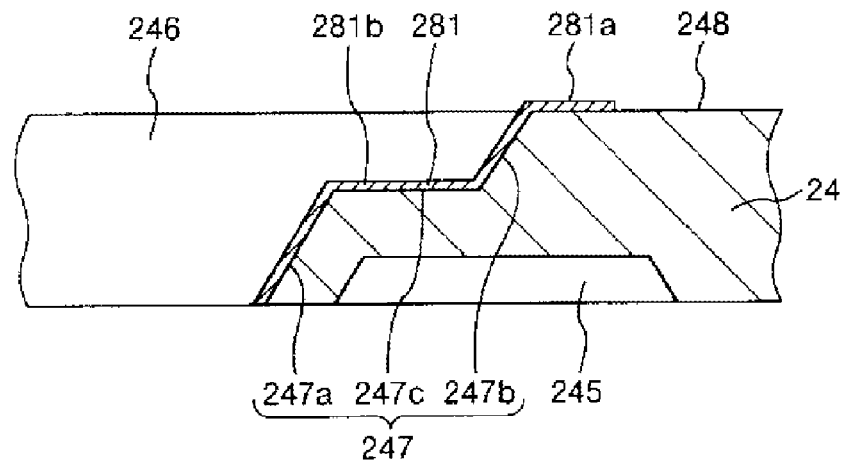
FIG. 13C is a sectional view illustrating a method of manufacturing the liquid droplet ejecting head shown in FIG. 12.
Figure 14A:
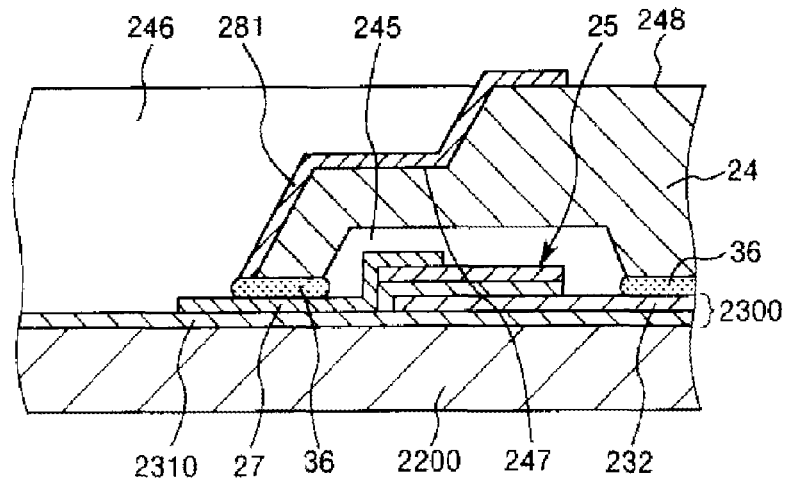
FIG. 14A is a sectional view illustrating a method of manufacturing the liquid droplet ejecting head shown in FIG. 12.
Figure 14B:
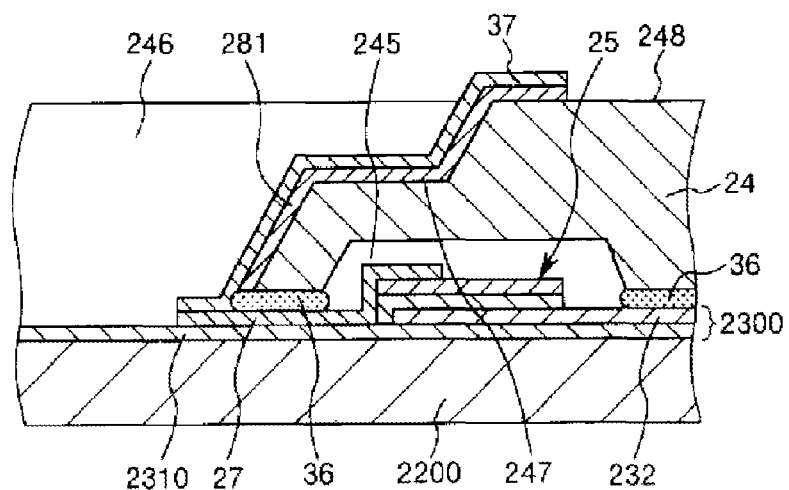
FIG. 14B is a sectional view illustrating a method of manufacturing the liquid droplet ejecting head shown in FIG. 12.

Next, as shown in FIG. 13C, the reservoir forming substrate 24 is prepared, and the wirings 281 are formed on the reservoir forming substrate 24. The formation of the reservoir forming substrate 24 and the formation of the wirings 281 can be performed using the same method as in the above-described first embodiment. Next, as shown in FIG. 14A, the reservoir forming substrate 24 is bonded to the upper surface of the substrate 2300 through the adhesive 36. At this time, it is preferable that the adhesive 36 is provided so as to protrude inside the through portion 246. The wirings 281 are not in contact with the terminals 27.

Next, a laminate obtained by the above-described process is immersed in an electroless plating solution, and a metal film is educed on the terminal 27 and the wiring 281 to form the connecting member 37. While the terminal 27 and the wiring 281 are separated from each other by the thickness of the adhesive 36, since the connecting member 37 is formed to extend over the terminal 27 and the wiring 281 (specifically, since the connecting member 37 educed on the terminal 27 and the connecting member 37 educed on the wiring 281 are connected together), the terminal 27 and the wiring 281 are electrically connected together through the connecting member 37. The configuration of the connecting member 37 is not particularly limited, and for example, a laminated structure in which a Ni layer, a Pd layer, and an Au layer are laminated in order may be made.

Figure 14C:
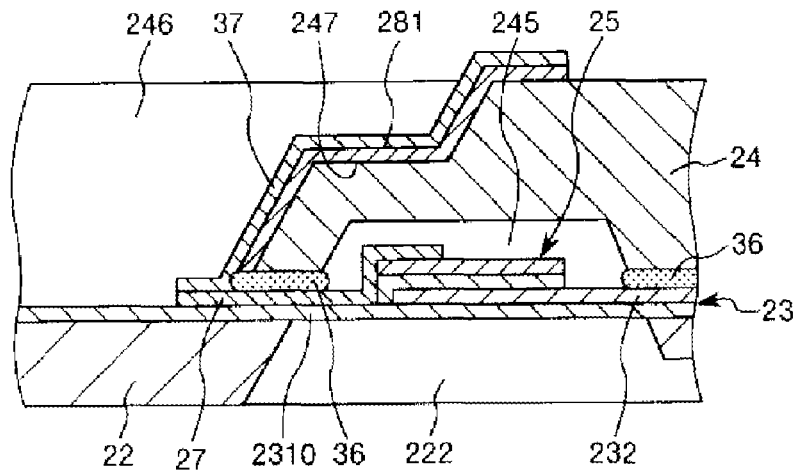
FIG. 14C is a sectional view illustrating a method of manufacturing the liquid droplet ejecting head shown in FIG. 12.
Figure 15A:
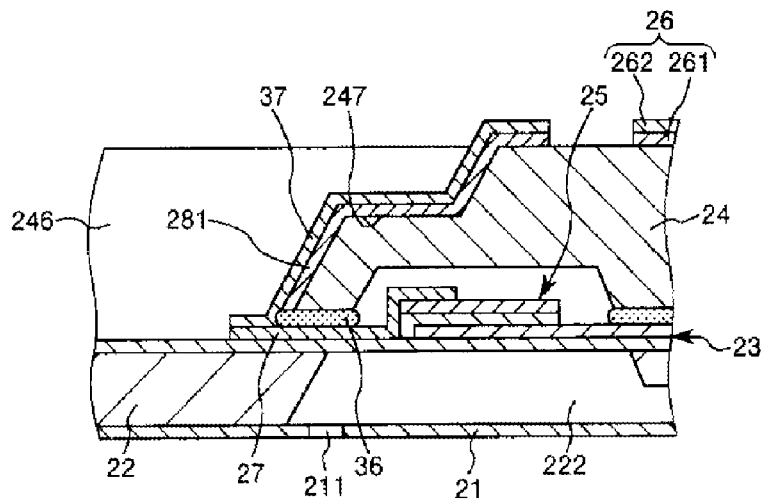
FIG. 15A is a sectional view illustrating a method of manufacturing the liquid droplet ejecting head shown in FIG. 12.
Figure 15B:
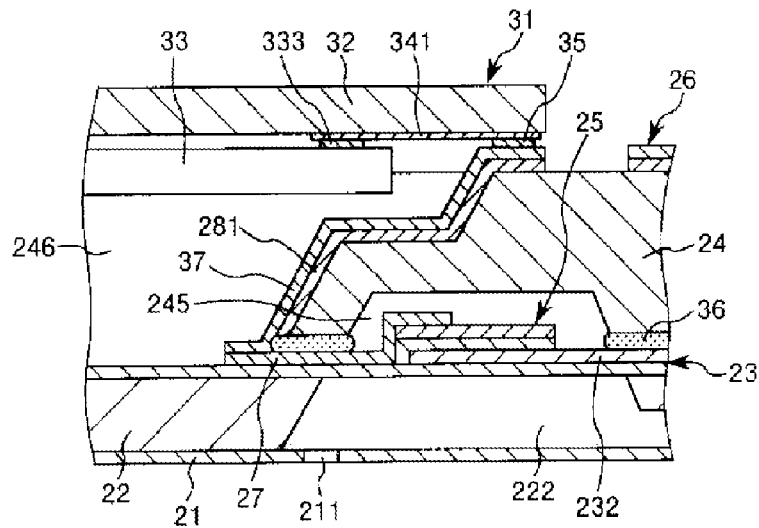
FIG. 15B is a sectional view illustrating a method of manufacturing the liquid droplet ejecting head shown in FIG. 12.
Figure 15C:
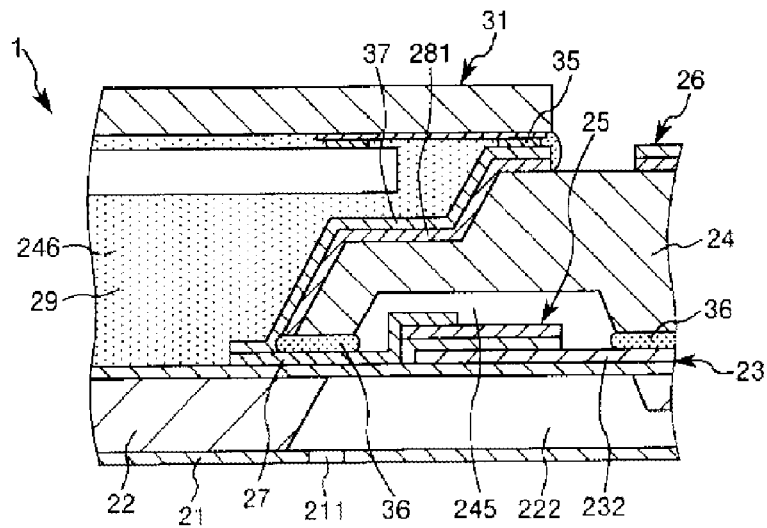
FIG. 15C is a sectional view illustrating a method of manufacturing the liquid droplet ejecting head shown in FIG. 12.

Next, the substrate 2200 and the elastic film 2310 are patterned in order using a photolithography technique and an etching technique, and thus, as shown in FIG. 14C, the vibrating plate 23 and the flow channel forming substrate 22 are obtained. Next, as shown in FIG. 15A, the nozzle substrate 21 is bonded to the lower surface of the flow channel forming substrate 22, and the compliance substrate 26 is bonded to the upper surface of the reservoir forming substrate 24. Next, the IC mounting substrate 31 with the bumps 35 is prepared, and as shown in FIG. 15B, the IC mounting substrate 31 is bonded to the reservoir forming substrate 24 through the bumps 35. Finally, as shown in FIG. 15C, the through portion 246 is filled with the adhesive 29, whereby the liquid droplet ejecting head 1 is obtained.

According to the method of manufacturing the liquid droplet ejecting head 1, it is possible to form the reliable liquid droplet ejecting head 1.

Next, as an example of a liquid droplet ejecting apparatus according to the invention, the liquid droplet ejecting apparatus 100 having the above-described liquid droplet ejecting head 1 will be described.

Figure 16:
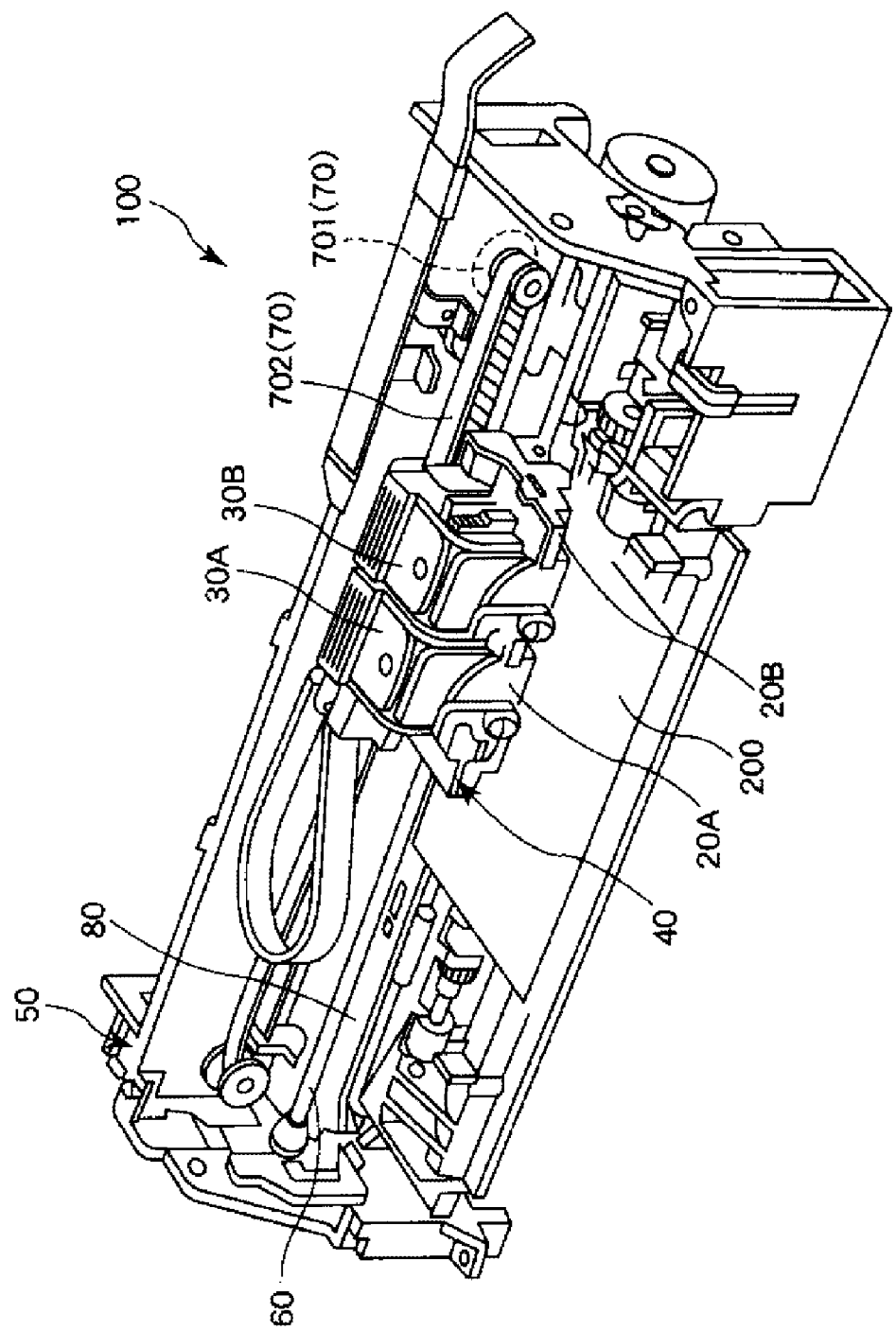
FIG. 16 is a perspective view showing an example of a liquid droplet ejecting apparatus according to an embodiment of the invention.

FIG. 16 is a perspective view showing the example of the liquid droplet ejecting apparatus according to the invention. The liquid droplet ejecting apparatus 100 (printing apparatus) shown in FIG. 16 is a printing apparatus which performs printing on a recording medium 200 in an ink jet system. The liquid droplet ejecting apparatus 100 includes an apparatus body 50, recording head units 20A and 20B with the liquid droplet ejecting head 1 mounted therein, ink cartridges 30A and 30B which supply the ink 300, a carriage 40 which transports the recording head units 20A and the 20B, a moving mechanism 70 which moves the carriage 40, and a carriage shaft 60 which movably supports (guides) the carriage 40.

The ink cartridge 30A is detachably mounted in the recording head unit 20A, and in this mounting state, the ink 300 (black ink composition) can be supplied to the recording head unit 20A.

The ink cartridge 30B is detachably mounted in the recording head unit 20B, and in this mounting state, the ink 300 (color ink composition) can be supplied to the recording head unit 20B.

The moving mechanism 70 has a drive motor 701 and a timing belt 702 connected to the drive motor 701. Then, a driving force (rotational force) of the drive motor 701 is transmitted to the carriage 40 through the timing belt 702, whereby the carriage 40 can be moved along the carriage shaft 60 along with the recording head units 20A and 20B.

The apparatus body 50 is provided with a platen 80 along the axial direction below the carriage shaft 60. The recording medium 200 fed by a sheet feed roller (not shown) is transported on the platen 80. Then, the ink 300 is ejected on the recording medium 200 on the platen 80, and printing is executed. According to this liquid droplet ejecting apparatus, it is possible to realize high-definition liquid droplet ejection.

Although the wiring structure, the method of manufacturing a wiring structure, the liquid droplet ejecting head, and the liquid droplet ejecting apparatus according to the invention have been described in connection with the embodiments shown in the drawings, the invention is not limited to the embodiments, and the respective portions which constitute the wiring structure, the liquid droplet ejecting head, and the liquid droplet ejecting apparatus can be replaced with arbitrary configurations having the same functions. Arbitrary components may be appended.

In the above-described embodiments, although an example where the wiring structure according to the invention is applied to a liquid droplet ejecting head has been described, the wiring structure according to the invention is not limited thereto, and the invention may be applied to various wiring structures insofar as a plurality of terminals on a base substrate and a plurality of wirings on the lateral surfaces of a wiring substrate bonded to the base substrate are electrically connected together.

In the above-described embodiments, an example where a liquid droplet ejecting apparatus ejects ink as liquid droplets on a recording medium, such as a printing sheet, to execute printing has been described, the liquid droplet ejecting apparatus according to the invention is not limited thereto, and for example, a liquid droplet ejecting apparatus may eject a liquid crystal display device forming material as liquid droplets to manufacture a liquid crystal display device (liquid crystal display), may eject an organic EL forming material as liquid droplets to manufacture an organic EL display device (organic EL device), or may eject a wiring pattern forming material as liquid droplets and may form a wiring pattern of an electronic circuit to manufacture a circuit board.

The entire disclosure of Japanese Patent Application No. 2013-035504 filed on Feb. 26, 2013 is expressly incorporated by reference herein.

The invention claimed is:

1. A wiring structure comprising:
   a base substrate on which a plurality of first terminals are formed;
   a wiring substrate which is bonded to the base substrate, and has an inner wall having an inclined surface at an acute angle with respect to the base substrate and a through portion;

a substrate which is bonded to the base substrate through the wiring substrate, and has a plurality of second terminals on the base substrate side;

a control unit which is mounted on the wiring substrate side of the substrate and is arranged in an area defined by the inner wall, the base substrate, and the substrate and is electrically connected to the plurality of second terminals; and a plurality of wirings which electrically connect the first terminals and the second terminals on the inclined surface, wherein the inner wall has a first inclined surface at an acute angle with respect to the base substrate, a second inclined surface at an acute angle with respect to the base substrate, and a plane which is located between the first inclined surface and the second inclined surface to connect the first inclined surface and the second inclined surface and is parallel to the base substrate, wherein a pitch between the plurality of second terminals is smaller than a pitch between the plurality of first terminals, and at least a part of the plurality of wirings has an extended portion which is inclined from the first terminal side on the inclined surface with a decreasing pitch from adjacent wirings with respect to an extension direction of the inclined surface, and an extended portion which extends from the second terminal side with a constant pitch from adjacent wirings in the extension direction of the inclined surface.

2. The wiring structure according to claim 1, wherein an end portion of the wirings on the first terminal side overlaps the first terminals.

3. The wiring structure according to claim 1, wherein the wirings are electrically connected to the first terminals through conductive connecting members.

4. The wiring structure according to claim 1, wherein the wirings extend from the inner wall to a mounting surface of the control unit of the substrate of the wiring substrate, and the wirings are electrically connected to the second terminals through conductive bumps between the wiring substrate and the substrate.

5. The wiring structure according to claim 1, wherein the wiring substrate is bonded to the base substrate through an insulating adhesive.

6. The wiring structure according to claim 1, wherein the wiring substrate is made of silicon, and the inclined surface is formed along a crystal plane of silicon.

7. A liquid droplet ejecting head comprising:
the wiring structure according to claim 1.

8. A liquid droplet ejecting apparatus comprising:
the liquid droplet ejecting head according to claim 7.

* * * * *